US012618896B2

(12) United States Patent
Ranganathan et al.

(10) Patent No.: US 12,618,896 B2
(45) Date of Patent: May 5, 2026

(54) ACTIVE THERMAL INTERPOSER DEVICE WITH THERMAL ISOLATION STRUCTURES

(71) Applicant: Advantest Test Solutions, Inc., San Jose, CA (US)

(72) Inventors: Karthik Ranganathan, San Jose, CA (US); Aritomo Kikuchi, San Jose, CA (US); Merlin Wallner, San Jose, CA (US); Rajan Surve, San Jose, CA (US); Samer Kabbani, Laguna Niguel, CA (US); Paul Ferrari, San Jose, CA (US); Ikeda Hiroki, San Jose, CA (US); Kiyokawa Toshiyuki, San Jose, CA (US); Gregory Cruzan, San Jose, CA (US); Todd Berk, Rancho Santa Margarita, CA (US); Ian Williams, San Jose, CA (US); Mohammad Ghazvini, San Jose, CA (US); Thomas Jones, San Jose, CA (US)

(73) Assignee: Advantest Test Solutions, Inc., San Jose, CA (US)

( * ) Notice: Subject to any disclaimer, the term of this patent is extended or adjusted under 35 U.S.C. 154(b) by 0 days.

(21) Appl. No.: 18/440,226

(22) Filed: Feb. 13, 2024

(65) Prior Publication Data

US 2024/0183898 A1       Jun. 6, 2024

Related U.S. Application Data

(63) Continuation-in-part of application No. 18/204,309, filed on May 31, 2023, now Pat. No. 12,216,154,
(Continued)

(51) Int. Cl.
*G01R 31/28*        (2006.01)
*G01R 1/04*        (2006.01)

(52) U.S. Cl.
CPC ....... *G01R 31/2875* (2013.01); *G01R 1/0458* (2013.01); *G01R 31/2863* (2013.01); *G01R 31/2867* (2013.01); *G01R 31/2874* (2013.01)

(58) Field of Classification Search
CPC ... G01R 31/286; G01R 31/2875; G01R 31/70
See application file for complete search history.

(56) References Cited

U.S. PATENT DOCUMENTS

| | | | |
|---|---|---|---|
| 5,126,656 | A | 6/1992 | Jones |
| 5,164,661 | A | 11/1992 | Jones |

(Continued)

FOREIGN PATENT DOCUMENTS

| | | |
|---|---|---|
| CN | 101073016 A | 11/2007 |
| CN | 103038751 A | 4/2013 |

(Continued)

OTHER PUBLICATIONS

Ranganathan et al. D517: Shielded Socket and Carrier for High-Volume Test of Semiconductor Devices; Powerpoint; 12 pp. Sep. 30, 2021.

*Primary Examiner* — Tung X Nguyen

(57)        ABSTRACT

An active thermal interposer (ATI) device for use in testing integrated circuit device under test (DUT) having thermal isolation structures. The ATI device includes a formation having a first surface and a second surface, wherein the first surface is operable to be disposed adjacent to a cold plate, and a plurality of heating zones defined across a second surface of the formation, the plurality of heating zones operable to be controlled by a thermal controller to selectively heat and maintain respective temperatures thereof, the plurality of heating zones operable to heat a plurality of areas of the DUT when the second surface of the formation is disposed adjacent to an interface surface of the DUT during testing of the DUT. The ATI device includes a
(Continued)

100 plurality of thermal resistance structures configured to resist thermal conductance between the plurality of heating zones.

25 Claims, 15 Drawing Sheets

Related U.S. Application Data which is a continuation of application No. 17/841,471, filed on Jun. 15, 2022, now Pat. No. 11,846,669, which is a continuation of application No. 17/531,638, filed on Nov. 19, 2021, now Pat. No. 11,609,266.

(60) Provisional application No. 63/121,532, filed on Dec. 4, 2020.

(56) References Cited

U.S. PATENT DOCUMENTS

| | | | |
|---|---|---|---|
| 5,239,093 A | 8/1993 | Cheng | |
| 5,315,240 A | 5/1994 | Jones | |
| 5,329,093 A | 7/1994 | Okano | |
| 5,420,521 A | 5/1995 | Jones | |
| 5,738,531 A | 4/1998 | Beaman et al. | |
| 5,821,505 A | 10/1998 | Tustaniwskyj et al. | |
| 5,909,657 A | 6/1999 | Onishi et al. | |
| 6,184,504 B1 | 2/2001 | Cardella | |
| 6,359,264 B1 | 3/2002 | Schaper et al. | |
| 6,389,225 B1 | 5/2002 | Malinoski et al. | |
| 6,452,113 B2 | 9/2002 | Dibene, II et al. | |
| 6,498,899 B2 | 12/2002 | Malinoski et al. | |
| 6,515,470 B2 | 2/2003 | Suzuki et al. | |
| 6,668,570 B2 | 12/2003 | Wall et al. | |
| 6,711,904 B1 | 3/2004 | Law et al. | |
| 6,825,681 B2 | 11/2004 | Feder et al. | |
| 6,862,405 B2 | 3/2005 | Malinoski et al. | |
| 6,985,000 B2 | 1/2006 | Feder et al. | |
| 7,042,240 B2 | 5/2006 | Lopez et al. | |
| 7,126,217 B2 | 10/2006 | Chiu et al. | |
| 7,138,811 B1 | 11/2006 | Mahoney et al. | |
| 7,151,388 B2 | 12/2006 | Gopal et al. | |
| 7,311,782 B2 | 12/2007 | Strang et al. | |
| 7,355,428 B2 | 4/2008 | Kabbani et al. | |
| 7,411,792 B2 | 8/2008 | Richards et al. | |
| 7,436,059 B1 | 10/2008 | Ouyang | |
| 7,519,880 B1 | 4/2009 | Johnson et al. | |
| 7,626,407 B2 | 12/2009 | Kabbani | |
| 7,646,596 B2 | 1/2010 | Ng | |
| 7,659,738 B2 | 2/2010 | Hong | |
| 7,726,145 B2 | 6/2010 | Nakamura | |
| 7,755,899 B2 | 7/2010 | Stenmark | |
| 7,781,883 B2 | 8/2010 | Sri-Jayantha et al. | |
| 7,830,164 B2 | 11/2010 | Earle et al. | |
| 7,848,106 B2 | 12/2010 | Merrow | |
| 7,929,303 B1 | 4/2011 | Merrow | |
| 8,343,280 B2 | 1/2013 | Iimuro | |
| 8,558,540 B2 | 10/2013 | Wu et al. | |
| 8,772,682 B2 | 7/2014 | Ambal et al. | |
| 8,927,907 B2 | 1/2015 | Fink et al. | |
| 8,970,244 B2 | 3/2015 | Suzuki et al. | |
| 9,080,820 B2 | 7/2015 | Bolton | |
| 9,291,667 B2 | 3/2016 | Armstrong et al. | |
| 9,307,578 B2 | 4/2016 | Pease | |
| 9,310,145 B2 | 4/2016 | Colongo et al. | |
| 9,400,291 B2 * | 7/2016 | Johnson | G01R 31/2874 |
| 9,414,526 B2 | 8/2016 | Mann et al. | |
| 9,494,353 B2 | 11/2016 | Yu et al. | |
| 9,594,113 B2 | 3/2017 | Davis et al. | |
| 9,709,622 B2 | 7/2017 | Lopez et al. | |
| 9,766,287 B2 | 9/2017 | Narasaki et al. | |
| 9,841,772 B2 | 12/2017 | Bucher | |
| 10,056,225 B2 | 8/2018 | Gaff et al. | |
| 10,126,356 B2 | 11/2018 | Barabi et al. | |
| 10,163,668 B2 | 12/2018 | Steinhauser | |
| 10,354,785 B2 | 7/2019 | Yamaguchi et al. | |
| 10,656,200 B2 | 5/2020 | Cruzan et al. | |
| 10,775,408 B2 | 9/2020 | Carvalho et al. | |
| 10,908,207 B2 | 2/2021 | Barabi et al. | |
| 10,955,466 B2 | 3/2021 | Tsai et al. | |
| 10,983,145 B2 | 4/2021 | Akers et al. | |
| 11,143,697 B2 | 10/2021 | Wolff | |
| 11,493,551 B2 | 11/2022 | Ranganathan et al. | |
| 2002/0026258 A1 | 2/2002 | Suzuki et al. | |
| 2002/0118032 A1 | 8/2002 | Norris et al. | |
| 2003/0155939 A1 | 8/2003 | Lutz et al. | |
| 2004/0017185 A1 | 1/2004 | Song et al. | |
| 2005/0026476 A1 | 2/2005 | Mok et al. | |
| 2005/0086948 A1 | 4/2005 | Milke-Rojo et al. | |
| 2005/0103034 A1 | 5/2005 | Hamilton et al. | |
| 2005/0151553 A1 | 7/2005 | Kabbani et al. | |
| 2005/0169733 A1 | 8/2005 | Drynkin et al. | |
| 2006/0158207 A1 | 7/2006 | Reitinger | |
| 2006/0290370 A1 | 12/2006 | Lopez | |
| 2009/0160472 A1 | 6/2009 | Segawa et al. | |
| 2009/0218087 A1 | 9/2009 | Oshima | |
| 2010/0042355 A1 | 2/2010 | Aube et al. | |
| 2011/0050268 A1 | 3/2011 | Co et al. | |
| 2011/0074080 A1 | 3/2011 | Di Stefano et al. | |
| 2013/0181576 A1 | 7/2013 | Shiozawa et al. | |
| 2013/0285686 A1 | 10/2013 | Malik et al. | |
| 2014/0035715 A1 | 2/2014 | Takahashi et al. | |
| 2014/0251214 A1 | 9/2014 | Cuvalci et al. | |
| 2015/0028908 A1 | 1/2015 | Kushnick et al. | |
| 2015/0028912 A1 | 1/2015 | Cho et al. | |
| 2015/0137842 A1 | 5/2015 | Murakami et al. | |
| 2015/0168450 A1 | 6/2015 | Wooden et al. | |
| 2015/0226794 A1 | 8/2015 | Chen | |
| 2015/0300719 A1 * | 10/2015 | Strickland | F25B 25/005 62/62 |
| 2016/0084880 A1 | 3/2016 | Locicero et al. | |
| 2016/0247552 A1 | 8/2016 | Kim et al. | |
| 2016/0351526 A1 | 12/2016 | Boyd et al. | |
| 2017/0059635 A1 | 3/2017 | Orchanian et al. | |
| 2017/0102409 A1 | 4/2017 | Sarhad et al. | |
| 2017/0363680 A1 | 12/2017 | Saito et al. | |
| 2018/0024188 A1 | 1/2018 | Cruzan et al. | |
| 2018/0189159 A1 | 7/2018 | Carmichael et al. | |
| 2018/0218926 A1 | 8/2018 | Stuckey et al. | |
| 2019/0064254 A1 | 2/2019 | Bowyer et al. | |
| 2019/0064261 A1 | 2/2019 | Bowyer et al. | |
| 2019/0162777 A1 | 5/2019 | Chiang et al. | |
| 2019/0271719 A1 | 9/2019 | Sterzbach | |
| 2019/0310314 A1 | 10/2019 | Liu et al. | |
| 2019/0346482 A1 | 11/2019 | Kiyokawa et al. | |
| 2020/0041564 A1 | 2/2020 | Cojoneanu et al. | |
| 2020/0363104 A1 | 11/2020 | Macdonald et al. | |
| 2020/0371155 A1 | 11/2020 | Walczyk et al. | |
| 2021/0071917 A1 | 3/2021 | Pei et al. | |
| 2021/0183668 A1 | 6/2021 | Cagle et al. | |
| 2021/0293495 A1 | 9/2021 | Barako et al. | |
| 2021/0366771 A1 | 11/2021 | Sreenivasan et al. | |
| 2021/0396801 A1 | 12/2021 | Ranganathan et al. | |
| 2022/0044084 A1 | 2/2022 | Cardy | |
| 2022/0082587 A1 | 3/2022 | Gopal et al. | |
| 2022/0128597 A1 | 4/2022 | Mckenna et al. | |
| 2022/0128599 A1 | 4/2022 | Campbell et al. | |
| 2022/0137092 A1 | 5/2022 | Ranganathan et al. | |
| 2022/0137129 A1 | 5/2022 | Ranganathan et al. | |
| 2022/0206061 A1 | 6/2022 | Ranganathan et al. | |
| 2022/0284982 A1 | 9/2022 | Ranganathan et al. | |
| 2023/0296667 A1 | 9/2023 | Ranganathan et al. | |

FOREIGN PATENT DOCUMENTS

| CN | 105144114 A | 12/2015 |
|---|---|---|
| CN | 109716513 A | 5/2019 |
| CN | 110214270 A | 9/2019 |
| CN | 110618903 A | 12/2019 |
| EP | 3270261 A1 | 4/2023 |
| JP | 2005156172 A | 6/2005 |
| JP | 2008275512 A | 11/2008 |
| KR | 10-2007-0027524 A | 3/2007 |
| KR | 20070027524 A | 3/2007 |
| KR | 10-2017-0143458 A | 12/2017 |

(56)  References Cited

FOREIGN PATENT DOCUMENTS

| | | | |
|---|---|---|---|
| KR | 10-2022-0079467 | A | 6/2022 |
| TW | 446682 | B | 7/2001 |
| TW | 200535440 | A | 11/2005 |
| TW | 200620596 | A | 6/2006 |
| TW | 200628818 | A | 8/2006 |
| TW | 201226579 | A | 7/2012 |
| TW | 201229535 | A | 7/2012 |
| TW | 201323883 | A | 6/2013 |
| TW | 201504647 | A | 7/2013 |
| TW | 201447325 | A | 12/2014 |
| TW | 201636618 | A | 12/2014 |
| TW | I651540 | B | 1/2016 |
| TW | 201608254 | A | 3/2016 |
| TW | 201712459 | A | 4/2017 |
| TW | 201834134 | A | 9/2018 |
| TW | 201840996 | A | 11/2018 |
| TW | 202004980 | A | 1/2020 |
| TW | 202043787 | A | 12/2020 |
| TW | 202242431 | A | 11/2022 |
| WO | 2016122039 | A1 | 8/2016 |
| WO | 201712076 | A1 | 1/2017 |
| WO | 2017015052 | A1 | 1/2017 |
| WO | 2017039936 | A1 | 3/2017 |
| WO | 2020159954 | A1 | 8/2020 |

* cited by examiner

124 ATI TIM
Cold Plate Side

126

126

126

126

150

156 test sled

130 Cold plate

Test board drawer 153

Test board 152

Stack 154

Test rack 159

Trolley 158

400

410 MCM Substrate

430

340'

320'

350'

460 pogo pins

440 Button

450 Retention

BGA 420

340 Top Thermal Layer

320 EMI Shield Layer

350 Heating Element Layer

Active Thermal Interposer Base 305

500

600

Start

610 PLACE DUT IN SOCKET AND CHECK FOR ALIGNMENT VIA OUT OF POSITION SENSOR

620 PLACE ACTIVE THERMAL INTERPOSER ON TOP OF THE DUT

630 AFTER PLACEMENT OF ATI, PERFORM A SECOND OUT OF POSITION CHECK

End

910

920c

920a

920d

920b

120

920

922

924

910

920

Active Thermal Interposer 120

1

ACTIVE THERMAL INTERPOSER DEVICE WITH THERMAL ISOLATION STRUCTURES

RELATED APPLICATION(S)

This Application is a Continuation in Part of, and claims priority to co-pending, commonly-owned U.S. application Ser. No. 18/204,309, filed May 31, 2023, entitled "Active Thermal Interposer Device," to Kabbani et al., which in turn was a Continuation of U.S. application Ser. No. 17/841,471, now U.S. Pat. No. 11,846,669, filed Jun. 15, 2022, entitled "Active Thermal Interposer Device," which in turn was a Continuation of U.S. application Ser. No. 17/531,638, now U.S. Pat. No. 11,609,266, filed Nov. 19, 2021, entitled "Active Thermal Interposer Device," which in turn claimed priority to U.S. Provisional Application Ser. No. 63/121,532, filed Dec. 4, 2020, entitled "Active Thermal Interposer." This application is related to U.S. Pat. No. 9,291,667 filed Mar. 4, 2014, entitled "Adaptive Thermal Control," Ser. No. 14/196,955. This application is related to U.S. Pat. No. 11,567,119, filed Nov. 19, 2021, entitled "Testing System Including Active Thermal Interposer Device," Ser. No. 17/531,649 and related to U.S. Pat. No. 11,754,620, filed May 13, 2022, entitled "DUT Placement and Handling for Active Thermal Interposer Device," Ser. No. 17/744,403 and related to U.S. Pat. No. 11,774,492, filed Jun. 15, 2022, entitled "Test System Including Active Thermal Interposer Device," Ser. No. 17/841,491. All such applications and/or patents are hereby incorporated herein by reference in their entireties.

FIELD OF INVENTION

Embodiments of the present invention relate to the field of integrated circuit manufacturing and testing. More specifically, embodiments of the present invention relate to systems and methods for maintaining thermal control of integrated circuits during testing thereof.

BACKGROUND

It is common to subject integrated circuits, either packaged or unpackaged, to environmental testing as an operation in a manufacturing process. Typically in such testing, the integrated circuit devices are subject to electrical testing, e.g., "test patterns," to confirm functionality while being subjected to environmental stress. For example, an integrated circuit is heated and/or cooled to its specification limits while being electrically tested. In some cases, e.g., for qualification testing, an integrated circuit may be stressed beyond its specifications, for example, to determine failure points and/or to establish a "guard band" on its environmental specifications.

Traditionally, such testing has included placing one or more integrated circuits and their associated test interface(s) and support hardware into an environmental chamber. The environmental chamber would heat and/or cool the integrated circuit(s) under test, known as or referred to as a device under test, or "DUT," as well as the test interface and support hardware, to the desired test temperature. Unfortunately, use of such test chambers has numerous drawbacks. For example, the limits and/or accuracy of such testing may be degraded due to environmental limits of the test interface circuits and/or devices. The substantial air volumes, mass of mounting structures, and necessary interface devices in an environmental test chamber may impede rapid changes in the testing environment, thus limiting the testing rate. Further, placing and removing DUTs and testing apparatus into and out of such test chambers further limits rates of testing, and requires complex and expensive mechanisms to perform such insertions and removals.

SUMMARY OF THE INVENTION

Therefore, what is needed are systems and methods for maintaining thermal control of integrated circuits while they are being tested. What is further needed is an active thermal interposer device with thermal isolation to perform the thermal control. What is additionally needed are systems and methods for active thermal interposer devices with thermal isolation operable to control different portions of a device under test to different temperatures. Further, there is a need for systems and methods for active thermal interposer devices with thermal isolation operable to control different portions of a device under test at different heights to different temperatures. There is a still further need for systems and methods for active thermal interposer devices with thermal isolation that are compatible and complementary with existing systems and methods of testing integrated circuits.

In accordance with embodiments of the present invention, an active thermal interposer (ATI) device for testing a device under test (DUT) includes a formation including one or more layers. The formation includes a first thermal zone and a second thermal zone. The first thermal zone is configured to apply thermal energy to a first thermal region of the DUT. The DUT may be an integrated circuit device. The second thermal zone is configured to apply thermal energy to a second thermal region of the DUT. The second thermal zone is configured to control a temperature of the second thermal region of the DUT independently of a temperature of the first thermal region of the DUT. The first thermal zone is configured to control the temperature of the first thermal region of the DUT independently of the temperature of the second thermal region of the DUT. The ATI device also includes a thermal resistance structure, disposed in the formation and located between the first thermal zone and the second thermal zone, the thermal resistance structure configured to limit conductance of thermal energy therebetween.

Embodiments include the above and further include wherein the thermal resistance structure includes a trench formed in the formation, located between the first thermal zone and the second thermal zone.

Embodiments include the above and further include wherein the trench is formed through all layers of the formation.

Embodiments include the above and further include wherein the trench is formed through fewer than all layers of the formation.

Embodiments include the above and further include an EMI shield layer.

Embodiments include the above and further include wherein the thermal resistance structure includes a structure raised above a surface of the formation.

Embodiments include the above and further include wherein the thermal resistance structure includes a same material as a surface of the ATI device.

Embodiments include the above and further include wherein the thermal resistance structure includes a plurality of substantially similar holes formed in the formation.

Embodiments include the above and further include wherein an EMI shield layer includes conductive elements in areas between the plurality of substantially similar holes.

In accordance with embodiments of the present invention, a stand-alone active thermal interposer device for use in testing the DUT and for coupling with a thermal controller. The stand-alone active thermal interposer device includes a body layer having a first surface and a second surface. The first surface is operable to be disposed adjacent to a cold plate. The stand-alone active thermal interposer device also includes a plurality of heating zones defined across a second surface of the body layer. The plurality of heating zones are operable to be controlled by the thermal controller to selectively heat and maintain respective temperatures thereof. The plurality of heating zones are operable to heat a plurality of areas of the DUT when the second surface of the body layer is disposed adjacent to an interface surface of the DUT during the testing of the DUT. The stand-alone active thermal interposer device further includes a plurality of thermal resistance structures formed in the body layer and operable to resist thermal conductance between the plurality of heating zones.

Embodiments include the above and further include a thermal head for coupling to the thermal controller and operable to interface with the stand-alone active thermal interposer device during the testing of the DUT. The thermal head includes the cold plate and an insulation cover for insulating the cold plate, wherein the insulation cover includes an injection port for reducing condensation from the cold plate.

Embodiments include the above and further include wherein the plurality of thermal resistance structures includes a plurality of trenches formed in the body layer and located between the plurality of heating zones.

Embodiments include the above and further include wherein the plurality of thermal resistance structures includes portions raised above a surface of the body layer.

Embodiments include the above and further include wherein the plurality of thermal resistance structures includes a same material as the body layer.

Embodiments include the above and further include wherein the plurality of thermal resistance structures includes a plurality of substantially similar holes formed in the body layer.

Embodiments include the above and further include a system of cooling to remove heat from the cold plate.

Embodiments include the above and further include a thermal interface material layer disposed between the stand-alone active thermal interposer device and the cold plate for coupling thermal energy from the stand-alone active thermal interposer device to the cold plate.

Embodiments include the above and further include wherein the plurality of heating zones include resistive heaters.

In accordance with an embodiment of the present invention, a testing arrangement for testing an integrated circuit device under test (DUT), the testing arrangement including a socket device for containing the DUT and for interfacing with a load board, a stand-alone active thermal interposer device for use in testing the DUT, the stand-alone active thermal interposer device including a body layer having a first surface and a second surface, wherein the first surface is operable to be disposed adjacent to a cold plate, and a plurality of heating zones defined across a second surface of the body layer, the plurality of heating zones operable to be controlled to selectively heat and maintain respective temperatures thereof, the plurality of heating zones operable to heat a plurality of areas of the DUT when the stand-alone active thermal interposer device is inserted into the socket device and the second surface of the body layer is disposed adjacent to an interface surface of the DUT, and wherein the body layer includes a plurality of thermal resistance structures configured to resist thermal conductance between the plurality of heating zones.

Embodiments include the above and further include a thermal head operable to interface with the stand-alone active thermal interposer device during the testing of the DUT, the thermal head including the cold plate, and a thermal controller for coupling with the stand-alone active thermal interposer device to control the plurality of heating zones and to control the cold plate. The thermal controller including firmware operable to perform thermal regulation during testing of the DUT. The firmware is further operable to obtain first temperatures which are of the cold plate from a temperature sensor of the cold plate, obtain second temperatures of the second surface of the stand-alone active thermal interposer device for each heating zone thereof using respective resistance temperature detectors, obtain third temperatures of each area of the DUT provided the DUT is active and circuitry on the load board is operable to collect a junction temperature for each area of the DUT, and based on the first temperatures, perform an outer slower loop to regulate a fan speed of the cold plate, and based on the second and third temperatures, perform an inner faster loop to regulate heater control of the plurality of heating zones of the stand-alone active thermal interposer device.

Embodiments include the above and further include wherein the plurality of thermal resistance structures includes a plurality of trenches formed in the body layer and located between the plurality of heating zones.

Embodiments include the above and further include wherein the plurality of thermal resistance structures includes portions raised above a surface of the body layer.

Embodiments include the above and further include wherein the plurality of thermal resistance structures includes a same material as the body layer.

In accordance with a method embodiment, a method of testing a system-in-package device under test (DUT) using an automated handler system and a tester system includes using a handler, automatically picking up the DUT from a tray and automatically placing the DUT into a socket, using an optical sensor to determine if the DUT is aligned planar with respect to its orientation within the socket, using the handler, automatically picking up an active thermal interposer device and automatically placing the active thermal interposer device on top of the DUT within the socket wherein the automatically placing the active thermal interposer device includes using alignment features of the active thermal interposer device and of the socket to align the active thermal interposer device, and using the optical sensor to determine if the active thermal interposer device is aligned planar regarding its orientation within the socket and with respect to the DUT.

Embodiments include the above and further include wherein the automatically picking up the DUT from a tray and automatically placing the DUT into a socket is performed by a first pick-and-place head of the handler and wherein further the automatically picking up an active thermal interposer device and automatically placing the active thermal interposer device onto top of the DUT within the socket is performed by a second pick-and-place head of the handler.

Embodiments include the above and further include wherein the automatically picking up an active thermal interposer device and automatically placing the active thermal interposer device onto top of the DUT within the socket further includes using an optical reader to read a two dimensional identification code disposed on the active thermal interposer device wherein the two dimensional identification code provides information including one of: an identification of the active thermal interposer device, thermal calibration data regarding the active thermal interposer device, and authentication information regarding the active thermal interposer device and further including relaying the information to the tester system.

In accordance with another method embodiment, a method of testing a system-in-package device under test (DUT) using an automated handler system and a tester system, the method includes using a first pick-and-place head of the handler, automatically picking up the DUT from a tray and automatically placing the DUT into a socket, and using a second pick-and-place head of the handler, automatically picking up an active thermal interposer device and automatically placing the active thermal interposer device onto top of the DUT within the socket wherein the automatically placing the active thermal interposer device includes aligning the active thermal interposer device using alignment features of the active thermal interposer device and of the socket.

Embodiments include the above and further include wherein the automatically picking up an active thermal interposer device and automatically placing the active thermal interposer device onto top of the DUT within the socket further includes using an optical reader to read a two dimensional identification code disposed on the active thermal interposer device wherein the two dimensional identification code provides information including one of: an identification of the active thermal interposer device, thermal calibration data regarding the active thermal interposer device, and authentication information regarding the active thermal interposer device and further including relaying the information to the tester system.

In accordance with a method embodiment, a method of testing a system-in-package device under test (DUT) using an automated handler system and a tester system, the method including using the handler, automatically picking up the DUT from a tray and automatically placing the DUT into a socket, using the handler, automatically picking up an active thermal interposer device and automatically placing the active thermal interposer device on top of the DUT within the socket, wherein the automatically placing the active thermal interposer device includes aligning the active thermal interposer device by using alignment features of the active thermal interposer device and of the socket, wherein the active thermal interposer device, the DUT and the socket each have a respective two dimensional code disposed thereon for identification, authorization and/or calibration purposes, and using an optical reader to read the two dimensional codes disposed on the active thermal interposer device, the DUT and the socket.

In accordance with another method embodiment, a method of testing a system-in-package device under test (DUT) using an automated handler system and a tester system, the method including using the handler, automatically picking up the DUT from a tray and automatically placing the DUT into a socket, wherein the DUT is secured within the socket via first retention features disposed within the socket, using the handler, automatically picking up an active thermal interposer device and automatically placing the active thermal interposer device on top of the DUT within the socket, wherein the active thermal interposer device is secured within the socket via second retention features disposed within the socket and wherein further if the active thermal interposer device is placed within the socket by the handler and the DUT is not within the socket, then the retention features are operable to prevent the active thermal interposer device from contacting pins of the socket.

In accordance with embodiments of the present invention, a testing device for testing a system-in-package device under test (DUT) includes a stand-alone active thermal interposer device for use in testing the DUT and for coupling with a thermal controller, the active thermal interposer device including a body layer having a first surface and a second surface, wherein the first surface is operable to be disposed adjacent to a cold plate, a plurality of heating zones defined across a second surface of the body layer, and a plurality of thermal resistance structures configured to resist thermal conductance between the plurality of heating zones. The plurality of heating zones operable to be controlled by a thermal controller to selectively heat and maintain respective temperatures thereof, the plurality of heating zones operable to heat a plurality of areas of the DUT when the second surface of the body layer is disposed adjacent to an interface surface of the DUT during testing of the DUT, and a thermal head for coupling to the thermal controller and operable to interface with the active thermal interposer device during testing of the DUT, the thermal head including: the cold plate, and an insulation cover for insulating the cold plate, wherein the insulation cover includes a compressed dry air (CDA) injection port for reducing condensation from the cold plate.

Embodiments include the above and further include a thermal interface material layer disposed between the active thermal interposer device and the cold plate for coupling thermal energy from the active thermal interposer device to the cold plate.

Embodiments include the above and further include wherein the thermal interface material layer includes a plurality of cutouts configured to prevent a pick and place handler from adhering to the thermal interface material layer.

In accordance with embodiments of the present invention, a testing arrangement for testing a system-in-package device under test (DUT), the arrangement including: a socket device for containing the DUT and for interfacing with a load board, stand-alone active thermal interposer device for use in testing the DUT, the active thermal interposer device including: a body layer having a first surface and a second surface, wherein the first surface is operable to be disposed adjacent to a cold plate, and a plurality of heating zones defined across a second surface of the body layer, the plurality of heating zones operable to be controlled to selectively heat and maintain respective temperatures thereof, the plurality of heating zones operable to heat a plurality of areas of the DUT when the active thermal interposer device is inserted into the socket and the second surface of the body layer is disposed adjacent to an interface surface of the DUT, a thermal head operable to interface with the active thermal interposer device during testing of the DUT, the thermal head including the cold plate, and a thermal controller for coupling with the active thermal interposer device to control the plurality of heating zones and to control the cold plate, the thermal controller including firmware operable to perform thermal regulation during testing of the DUT, the firmware operable to: obtain first temperatures which are of the cold plate from a temperature sensor of the cold plate, obtain second temperatures of the bottom surface of the active thermal interposer device for each heating zone thereof using respective resistance temperature detectors, obtain third temperatures of each area of the DUT provided the DUT is active and circuitry on the load board is operable to collect a junction temperature for each area of the DUT, based on the first temperatures, perform an outer slower loop to regulate a fan speed (for air control) or a fluid regulation valve (for liquid/refrigerant control) of the cold plate, and based on the second and third temperatures, perform an inner faster loop to regulate heater control/Peltier control of the plurality of heating zones of the active thermal interposer device.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

8

Figures 11A, 11B, 11C:
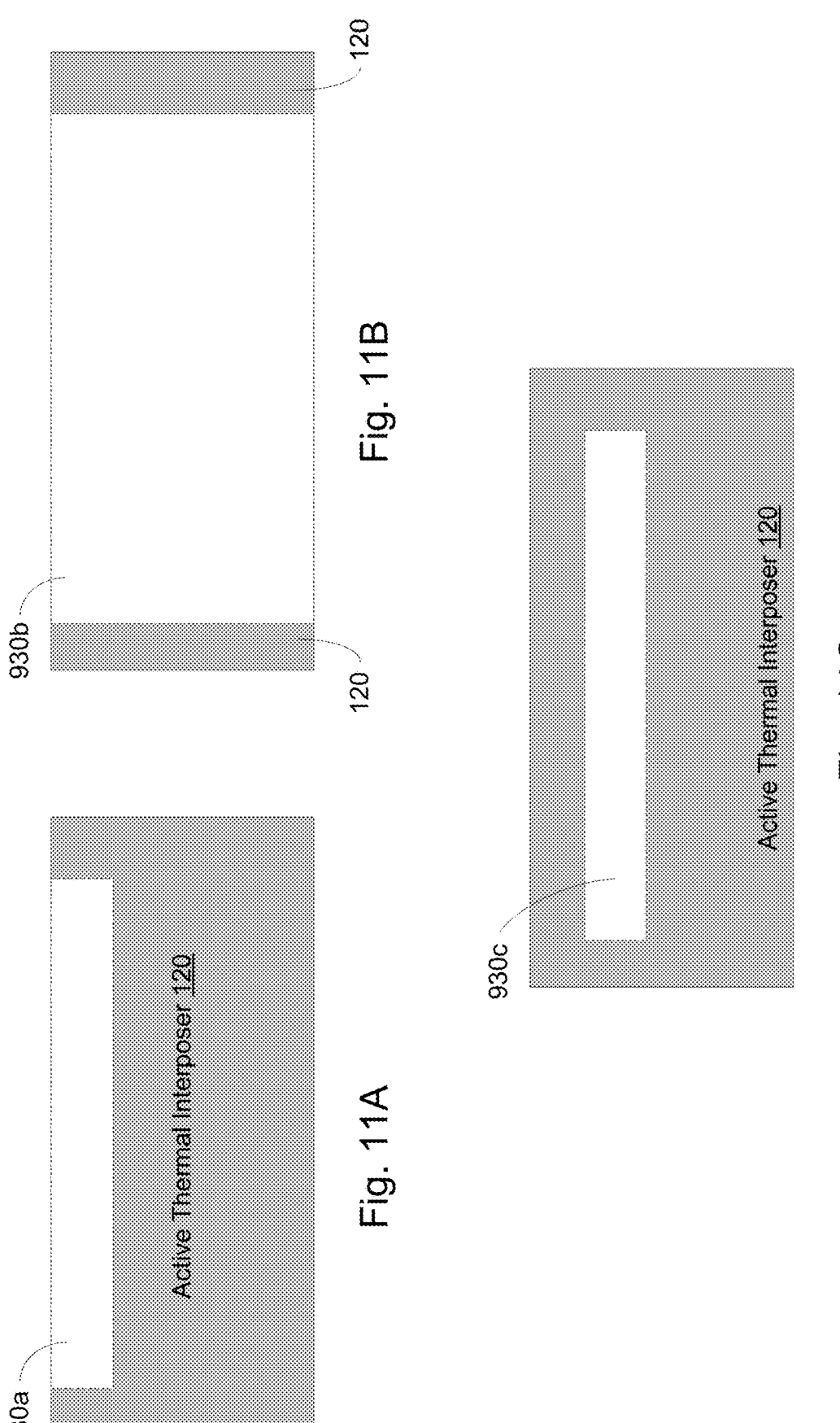
FIG. 11A illustrates a side-sectional view of an exemplary embodiment of a thermal resistance structure, in accordance with embodiments of the present invention.

FIG. 11B illustrates a side-sectional view of another exemplary embodiment of a thermal resistance structure, in accordance with embodiments of the present invention.

FIG. 11C illustrates a side-sectional view of a further exemplary embodiment of a thermal resistance structure, in accordance with embodiments of the present invention.

Figure 12:
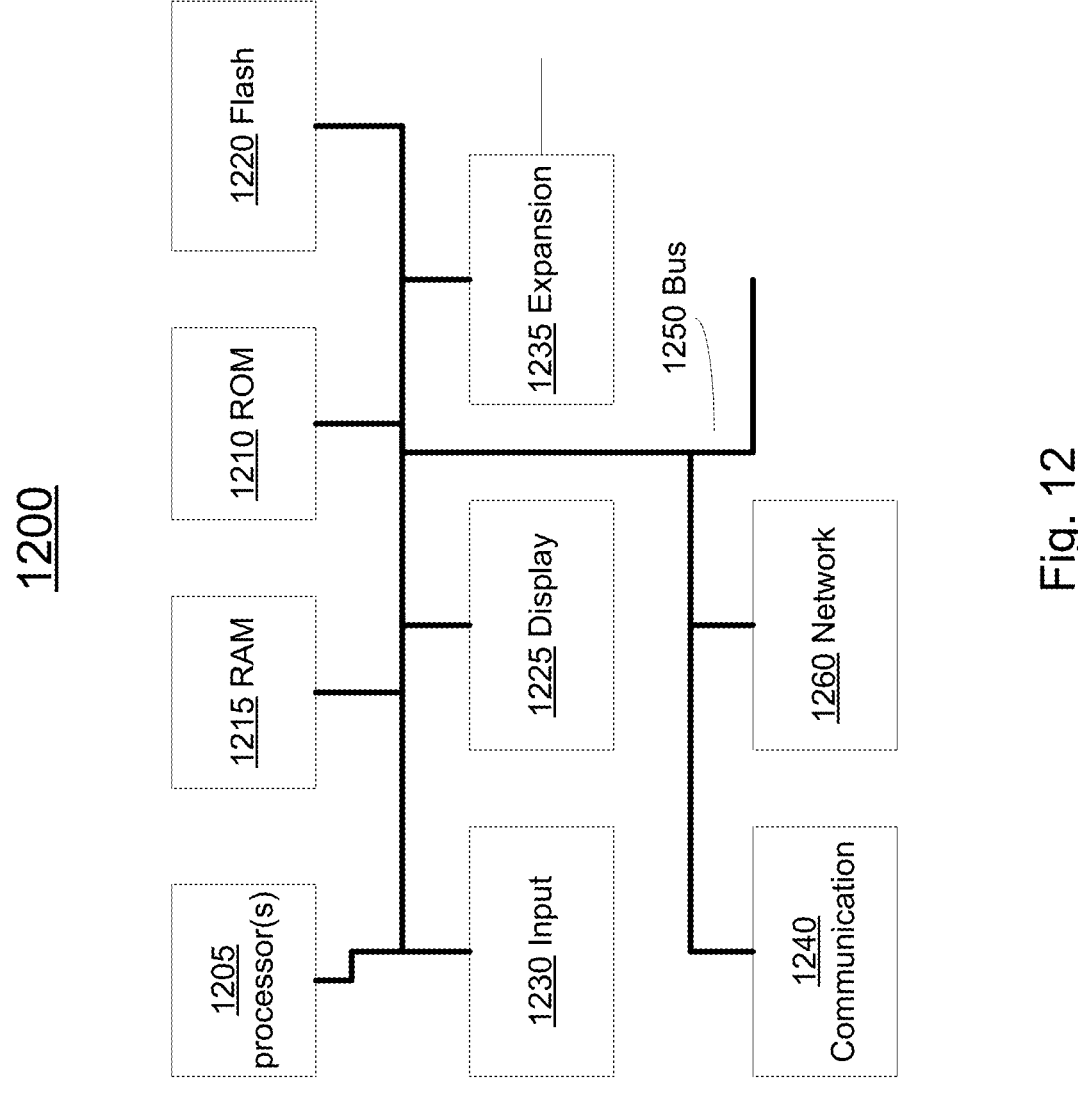

FIG. 12 illustrates a block diagram of an exemplary electronic system, which may be used as a platform to implement and/or as a control system for embodiments of the present invention.

DETAILED DESCRIPTION

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow (e.g., method 600) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "testing" or "heating" or "maintaining temperature" or "bringing" or "capturing" or "storing" or "reading" or "analyzing" or "generating" or "resolving" or "accepting" or "selecting" or "determining" or "displaying" or "presenting" or "computing" or "sending" or "receiving" or "reducing" or "detecting" or "setting" or "accessing" or "placing" or "testing" or "forming" or "mounting" or "removing" or "ceasing" or "stopping" or "coating" or "processing" or "performing" or "generating" or "adjusting" or "creating" or "executing" or "continuing" or "indexing" or "translating" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The meaning of "non-transitory computer-readable medium" should be construed to exclude only those types of transitory computer-readable media which were found to fall outside the scope of patentable subject matter under 35 U.S.C. § 101 in *In re Nuijten,* 500 F.3d 1346, 1356-57 (Fed. Cir. 2007). The use of this term is to be understood to remove only propagating transitory signals per se from the claim scope and does not relinquish rights to all standard computer-readable media that are not only propagating transitory signals per se.

Figure 1A:
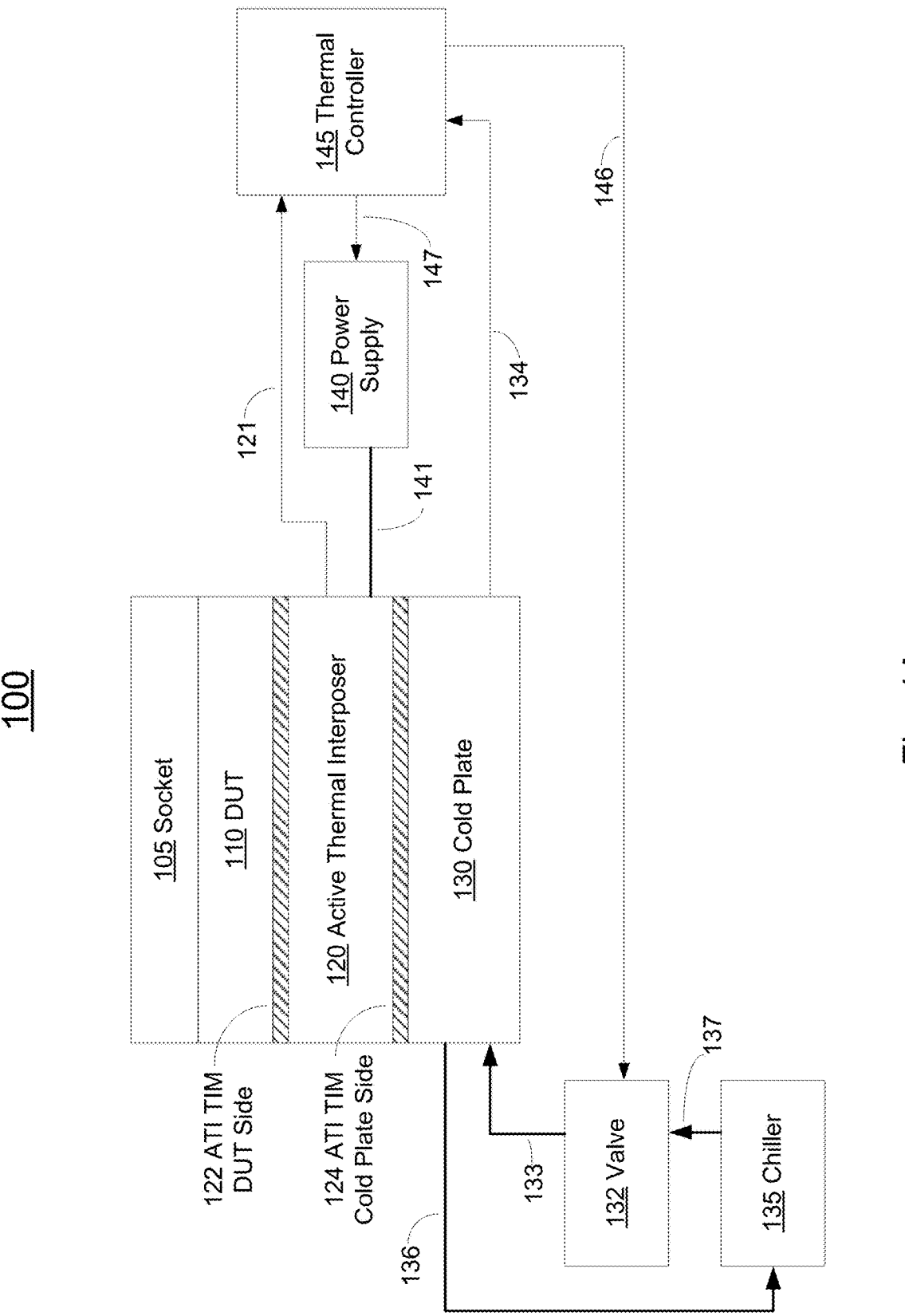
FIG. 1A illustrates an exemplary block diagram of elements of an automated test system that may serve as a platform for embodiments in accordance with the present invention.

FIG. 1A illustrates an exemplary block diagram of elements of an automated test system 100 that may serve as a platform for embodiments in accordance with the present invention. Test system 100 comprises a device under test (DUT) 110, for example, an integrated circuit device, a system in a package (SIP), and/or a multi-chip module (MCM). The device under test is typically packaged, but that is not required. A socket 105 is coupled to device under test 110, e.g., utilizing package leads on the DUT 110, to send and receive test signals and power to device under test 110. Socket 105 is typically coupled to, and tests, a single device under test 110 at a time, although that is not required. Socket 105 may be mounted to, or coupled to, a load board (not shown) for electrically coupling the socket 105 to a test controller, e.g., for electrical testing of DUT 110.

In accordance with embodiments of the present invention, a novel stand-alone active thermal interposer device 120 is coupled to the backside or top of device under test 110. Active thermal interposer device 120 may be customized for a specific design of device under test 110, in some embodiments. In some embodiments, there may be a thermal interface material (TIM) 122 between active thermal interposer device 120 and device under test 110. Such a thermal interface material, if present, is designed to improve thermal coupling between active thermal interposer device 120 and device under test 110.

In some embodiments, active thermal interposer device 120 may comprise a base layer of aluminum nitride (AlN) with tungsten and/or molybdenum traces. Active thermal interposer device 120 may comprise a formation of multiple layers. A high temperature co-fired ceramic (HTCC) process may be utilized. Such embodiments may be suitable for testing comparatively higher power devices. In some embodiments, a low temperature co-fired ceramic (LTCC) process, e.g., comprising aluminum oxide ($Al_2O_3$) may be utilized. Such embodiments may be suitable for testing comparatively lower power devices.

Active thermal interposer device 120 is further coupled to a cold plate 130, opposite to the device under test. In some embodiments, there may be a thermal interface material (TIM) 124 between active thermal interposer device 120 and cold plate 130. Such a thermal interface material, if present, is designed to improve thermal coupling between active thermal interposer device 120 and cold plate 130.

In an embodiment, a cooling fluid, e.g., comprising glycol, although other fluids, including air, may be used, is generally circulated through cold plate 130. To adjust the temperature of the cold plate 130, the temperature of the cooling fluid may be adjusted, in some embodiments. In some embodiments, as illustrated in FIG. 1A, the flow rate of the cooling fluid may also be adjusted, e.g., increased, reduced, started, and/or stopped. For example, a speed of a pump and/or fan may be adjusted. In an embodiment, chiller 135 cools the cooling fluid, e.g., to −60 degrees C. The cooling fluid flows 137 to valve 132. Valve 132, under the control of thermal controller 145 via control signal 146, regulates the flow 133 of cooling fluid to cold plate 130, based on one or more temperature measurements 134. After cycling through cold plate 130, the cooling fluid is returned 136 to the chiller 135. Cold plate 130 may also be air or gas cooled, in some embodiments. In this manner, thermal controller 145 may cool DUT 110 during testing via cooling action from chiller 135 and the cold plate 130.

In accordance with embodiments of the present invention, thermal controller 145 may implement some or all of the control processes described in U.S. Pat. No. 9,291,667 entitled "Adaptive Thermal Control," incorporated herein by reference in its entirety.

In some embodiments, cold plate 130 may comprise an evaporator and/or phase change cooling system. In such embodiments, chiller 135 may comprise a compressor and/or radiator, for example.

Active thermal interposer device 120 functions to apply heat energy to one or more temperature regions of device under test 110 during testing of the device under test 110. For example, each die of a multi-chip module device under test may be individually temperature controlled. To accomplish such heating, active thermal interposer device 120 comprises one or more heating elements disposed within a body layer or formation of the active thermal interposer device 120, as further described below. The heating elements of active thermal interposer device 120 define the temperature regions or zones of the device under test 110. In some embodiments, the heating elements may comprise resistive traces on a ceramic substrate. In some embodiments, the heating elements may comprise a cartridge heater. In some embodiments, the heating elements may comprise cooling elements, e.g., Peltier devices or other forms of thermoelectric coolers (TEC), capable of cooling as well. However, any suitable heating and/or cooling technology, in any combination, is well suited to embodiments in accordance with the present invention. Active thermal interposer device 120 also functions to couple heat energy from device under test 110 to cold plate 130 and/or to cooling elements within active thermal interposer device 120, in some embodiments.

Active thermal interposer device 120 further comprises one or more temperature measurement devices, e.g., resistance temperature detectors and/or thermocouples. The one or more temperature measurement devices are configured to measure a temperature of a region of device under test 110. The one or more temperature measurement devices may be located within or in close proximity to the heating elements of active thermal interposer device 120. In some embodiments, active thermal interposer device 120 may comprise temperature measurement devices characterized as not within or in close proximity to the heating elements of active thermal interposer device 120. In some embodiments, a load board may comprise temperature measurement devices. Each of the one or more temperature measurement devices sends a temperature signal 121 to thermal controller 145. Socket 105, device under test 110, active thermal interposer device 120, and cold plate 130 may be collectively known as or referred to as a test stack when coupled together as illustrated in FIG. 1A.

Test system 100 further comprises a thermal controller 145. Thermal controller 145 sends control signals 147 to power supply 140 to supply electrical power 141 to one or more heating elements of active thermal interposer device 120. Each heating element of active thermal interposer device 120 may be individually controlled. Accordingly, there are typically more power signals 141 than illustrated. There may be more than one power supply, in some embodiments. Based on temperature signal 121 from one or more of the plurality of temperature measurement devices, thermal controller may control power supply 140 to change the power supplied to a heating element. Power supply 140 may change a voltage level and/or pulse width modulate a voltage supplied to a heating element, in some embodiments. Thermal controller 145 also controls the amount of heat energy extracted 136 from cold plate 130. For example, thermal controller 145 controls the temperature of cold plate 130. Thermal controller 145 controls value 132 based on temperature signal 121.

It is to be appreciated that cold plate 130 extracts heat, through active thermal interposer device 120, from substantially all of device under test 110. In addition, cold plate 130 typically has a large thermal mass, and does not change temperature quickly. Accordingly, heating elements of active thermal interposer device 120 may often be required to overcome the cooling effect of cold plate 130, during DUT testing, for example. In some embodiments, different regions of a device under test 110 may be heated and/or cooled to different temperatures. For example, one region of device under test 110 may be heated to 100 degrees C., e.g., via a heater within active thermal interposer device 120, while another region of device under test 110 may be allowed to cool toward the temperature of cold plate 130 with no heat applied to such region by active thermal interposer device 120. Such differential heating and/or cooling of different regions of device under test 110 may produce a thermal gradient across or between regions of device under test 110, in some embodiments.

It is appreciated that active thermal interposer device 120 is a separate device from cold plate 130 and socket 105 and as such it is a stand-alone or discrete component. Active thermal interposer device 120 is typically customized for a particular device under test and/or socket combination, but that is not required. In this novel manner, since the active thermal interposer device is a stand-alone or discrete device, different active thermal interposer devices may be utilized with standard cold plates and/or a variety of sockets in various combination to test a variety of devices. For example, a functionally similar multi-chip module may have multiple versions with similar or identical pin layouts but a different physical arrangement of chips. Testing of such a family could be performed with the same socket with different active thermal interposer devices to account for a different physical arrangement of chips.

Figure 1B:
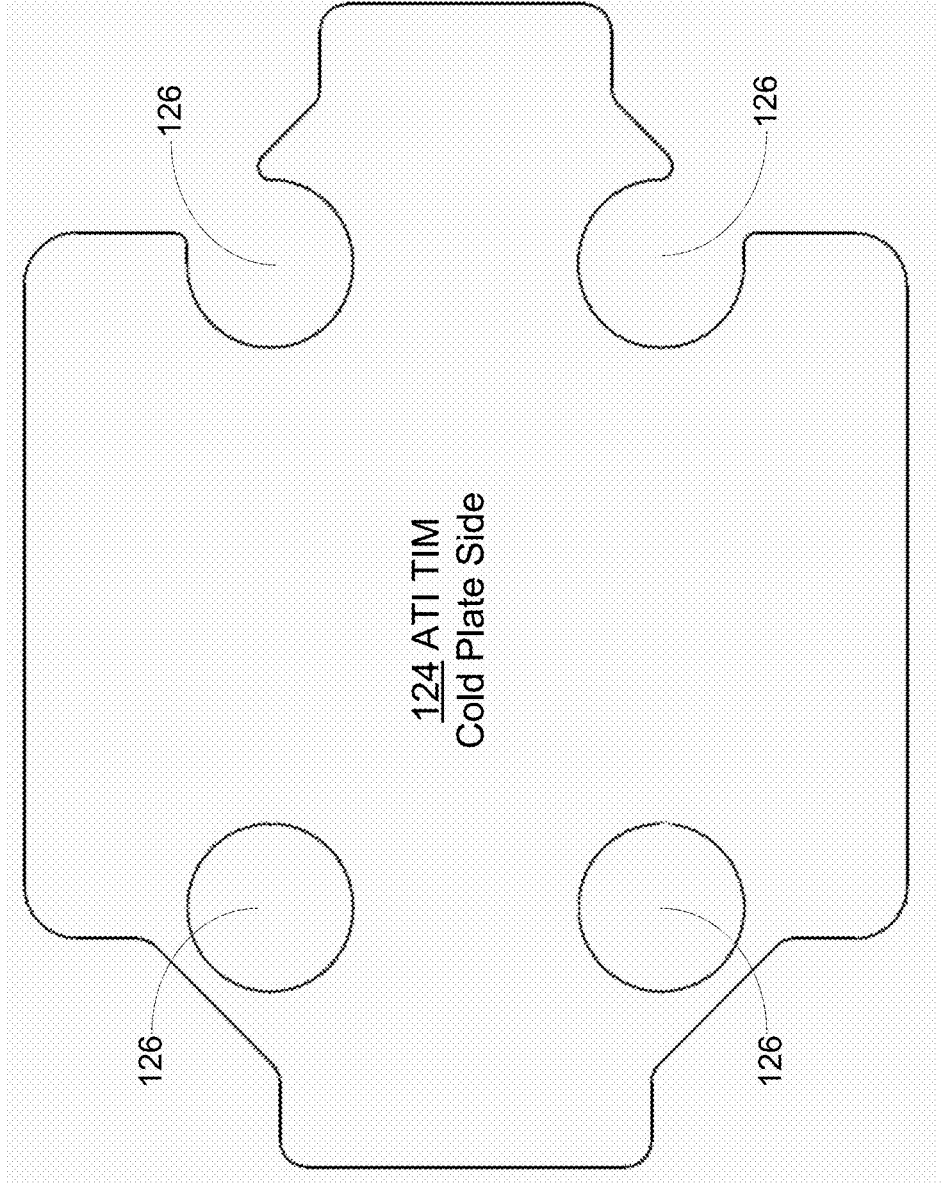
FIG. 1B illustrates a plan view of an exemplary cold plate side active thermal interposer thermal interface material, in accordance with embodiments of the present invention.

FIG. 1B illustrates a plan view of an exemplary cold plate side active thermal interposer thermal interface material 124, in accordance with embodiments of the present invention. Thermal interface material 124 is designed to improve thermal coupling between active thermal interposer device 120 and cold plate 130, and may typically be adhered to active thermal interposer device 120 (FIG. 1A), in some embodiments. Thermal interface material 124 may comprise indium foil coupled to an adhesive sheet, in some embodiments. In some embodiments, thermal interface material 124 comprises a plurality of cutouts 126. The cutout(s) match the contact location(s) of pick and place vacuum suction heads, in some embodiments. The cutout(s) may provide clearance for such pick and place vacuum suction heads in order to prevent a pick and place handler from adhering to the thermal interface material 124, e.g., when attempting to handle an active thermal interposer, e.g., active thermal interposer device 120.

Figure 1C:
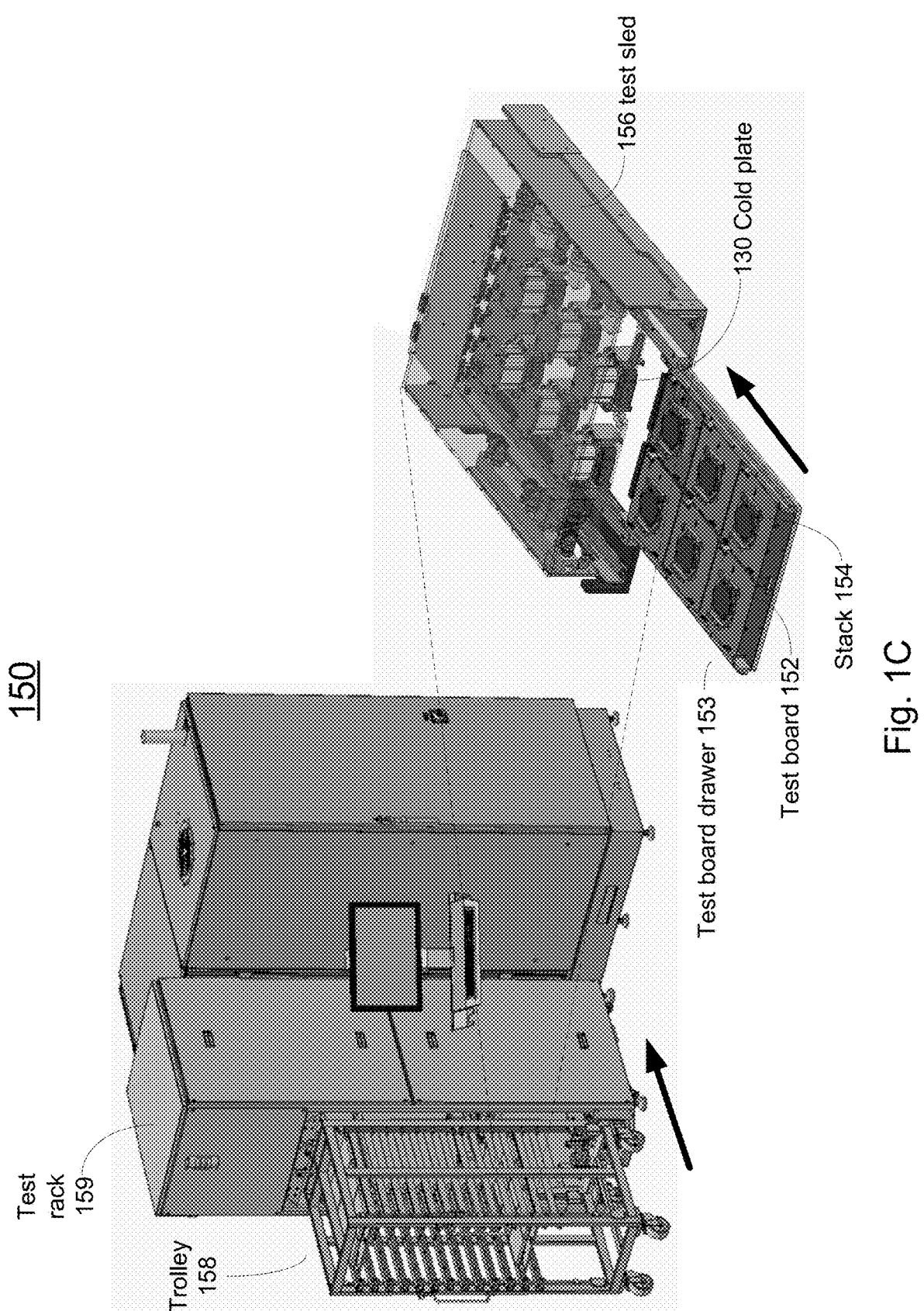
FIG. 1C illustrates a perspective view of an exemplary test system, in accordance with embodiments of the present invention.

FIG. 1C illustrates a perspective view of an exemplary test system 150, in accordance with embodiments of the present invention. Test system 150 comprises a plurality of test sleds, for example, exemplary test sled 156. Test sled 156 comprises a plurality, e.g., six, cold plates 130. Test sled 156 is configured to accept a test board drawer 153, which may be inserted into the main body of test sled 156. Test board drawer 153 comprises a test board 152. Test board 152 comprises a plurality, e.g., six, of stacks 154. Each of stacks 154 comprises a socket 105, a device under test 110 and an active thermal interposer device 120. Stack 154 may also include thermal interface materials 122 and/or 124, in some embodiments. Test sled 156 further comprises power distribution, and couplings to power, electrical test signals, and cooling fluids. Test sled 156 is configured to couple the plurality of cold plates to the stacks 154 when test board drawer 153 is inserted into the test sled 156. It is appreciated that the perspective of a test stack as illustrated in FIG. 1C is reversed with respect to the test stack as illustrated in FIG. 1A. For example, the cold plate 130 is on the top in FIG. 1C, while the cold plate 130 is illustrated on the bottom in FIG. 1A.

A plurality of test sleds 156, e.g., 12 (shown as exemplary), is configured to be placed in trolley 158, for insertion into a test rack 159. When inserted into test rack 159, the necessary electrical power, test signals, and cooling are supplied to each test stack comprising a cold plate 130, an active thermal interposer device 120, a device under test 110 and a socket 105 to be asynchronously tested by test system 150. In this novel manner, up to, for example, 72, devices may be heated and/or cooled, and electrically tested at the same time in a single test system 150.

Figure 1D:
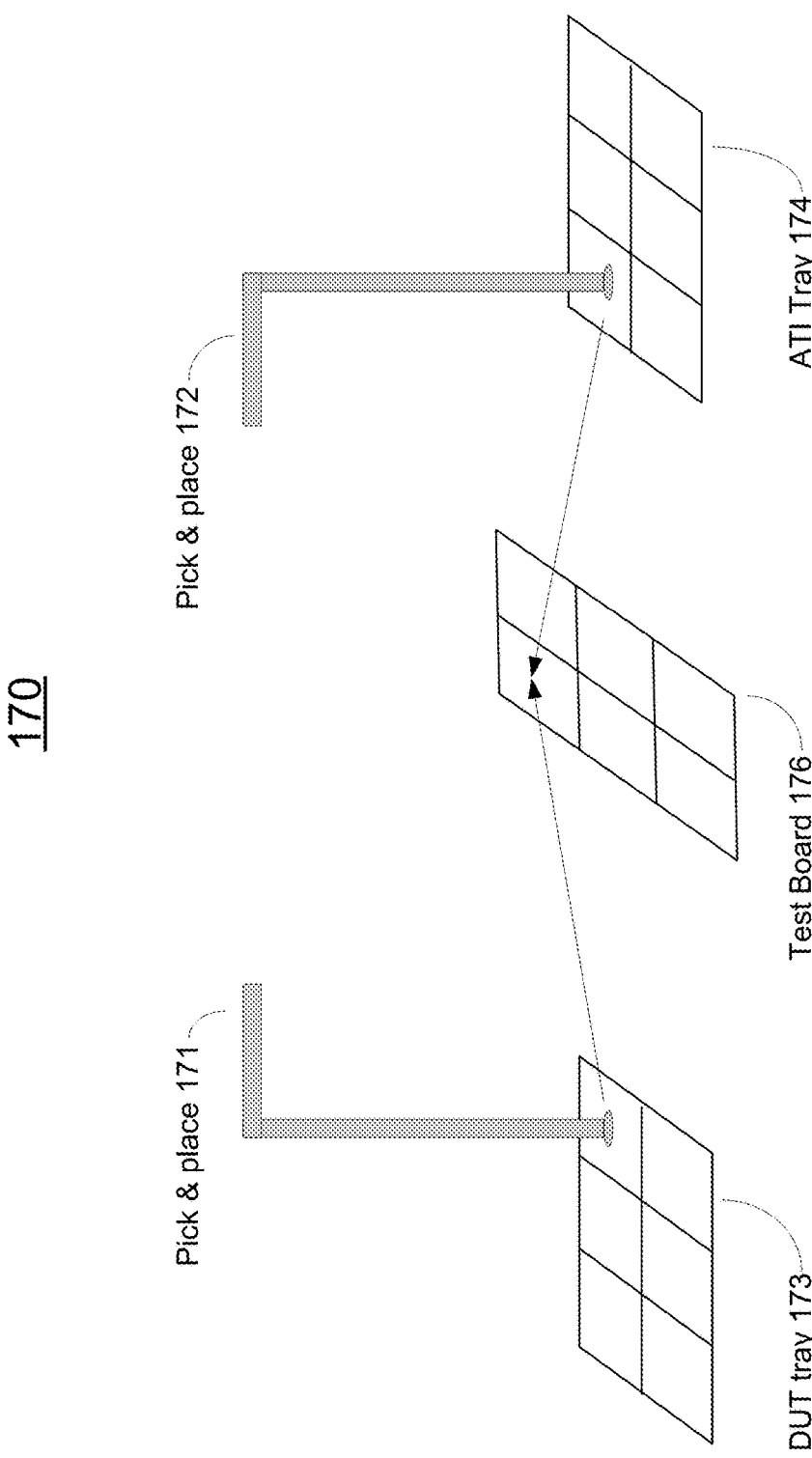
FIG. 1D illustrates an exemplary testing system including the robotic mechanisms for automatically picking and placing a DUT into the socket and also for picking an active thermal interposer device and placing it into the socket with the DUT, in accordance with embodiments of the present invention.

FIG. 1D illustrates an exemplary testing system 170 including the robotic mechanisms for automatically picking and placing a DUT into the socket and also for picking an active thermal interposer device and placing it into the socket with the DUT, in accordance with embodiments of the present invention. After placement into the socket, the DUT and the active thermal interposer device are passed to a thermal head. For example, the thermal head comprises a cold plate, e.g., cold plate 130. In one embodiment, the thermal head contains 12 slots; each slot containing 6 sockets, therefore 72 DUTs with corresponding active thermal interposer devices can be tested simultaneously. These numbers are exemplary only and fewer or more slots can be employed. After testing, the active thermal interposer devices may be reused to test other DUTs. Within the thermal head is contained the cold plates which come into contact with the active thermal interposer device during testing.

Within embodiments of the present invention, the active thermal interposer device is known as or referred to as a "stand-alone" or discrete device because it is not permanently attached to any other device within the testing system, as with the prior art testing systems and environments. In other words, the active thermal interposer device, being custom designed for the DUT, is actively picked and placed, as a stand alone part, and inserted into the socket as described above. Therefore, in order to redesign the testing system for use with another type of DUT, only the active thermal interposer device, the DUT and the socket need to be redesigned, while the remainder of the testing system, including a cold plate, may be reused.

Regarding FIG. 1D, a first pick and place arm 171 retrieves a device under test, e.g., DUT 110 of FIG. 1A, from a tray of DUTs 173, and places it into a socket, e.g., socket 105 (FIG. 1A) on a test board 176. The test board 176 may correspond to test board 152 of FIG. 1C. A second pick and place arm 172 retrieves an active thermal interposer device, e.g., active thermal interposer device 120 of FIG. 1A, from a tray of active thermal interposer devices 174, and places the active thermal interposer device on top of the DUT, which is already on test board 176. The pick and place arms 171, 172 may grasp the DUT and/or active thermal interposer device via any suitable means, including, for example, by grasping on sides and/or above and below, and/or via vacuum suction, in some embodiments.

Figure 2:
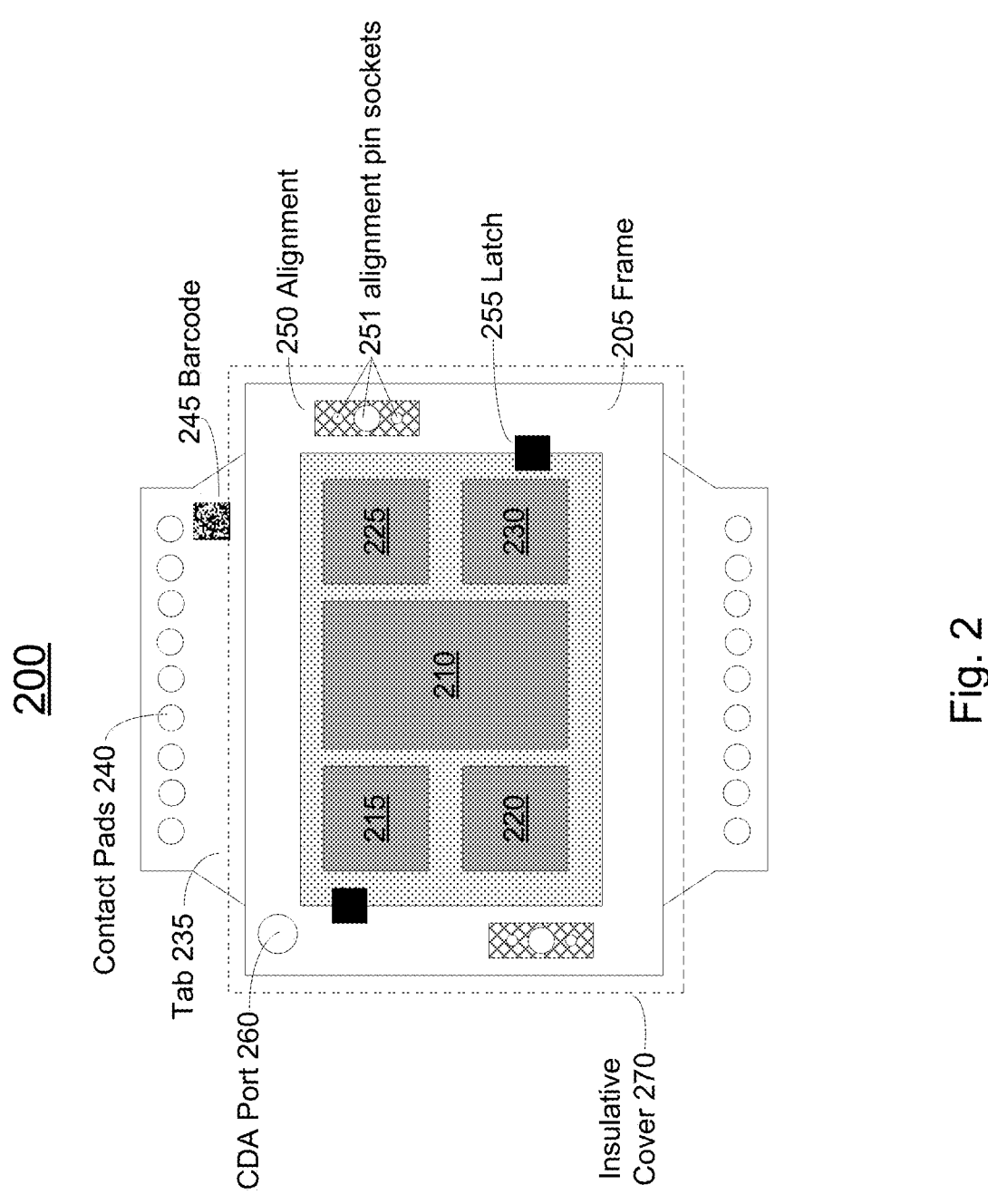
FIG. 2 illustrates an exemplary block diagram of a novel stand-alone active thermal interposer device, in accordance with embodiments of the present invention.

FIG. 2 illustrates an exemplary block diagram of a novel active thermal interposer device 200, in accordance with embodiments of the present invention. Active thermal interposer device 200 comprises a frame 205 upon which other elements may be attached or mounted. Frame 205 may comprise any suitable materials, for example, thermoplastics. Frame 205 comprises tabs 235. Tabs 235 are configured for handling and/or manipulation of active thermal interposer device 200, for example, by automated grasping equipment and/or pick and place equipment. A plurality of contact pads 240 may be located on tabs 235 for making electrical contact to active thermal interposer device 200. For example, contact pads 240 may be configured to mechanically and electrically couple with pogo pins (not shown) to couple electrical power and/or thermal sensor signals to/from active thermal interposer device 200. In some embodiments, the contact pads 240 may comprise pads of different sizes and/or shapes, for example, to correspond to different current capacities. In accordance with embodiments of the present invention, the ambient atmosphere near any pogo pins should be kept above the dew point in order to minimize and/or reduce condensation, which may have a deleterious effect on contact reliability. In accordance with embodiments of the present invention, active thermal interposer device 200 may comprise one or more compressed dry air (CDA) injection ports 260, which may be coupled to a source of dry air, and utilized to inject dry air into the test stack in order to prevent condensation. Active thermal interposer device 200 may comprise an insulation cover (not shown) to insulate device 200 from an ambient atmosphere to help prevent condensation, in some embodiments. The insulation cover may take any suitable shape.

Active thermal interposer device 200 may comprise latches 255, in some embodiments. Latches 255 are configured to securely couple a device under test (not shown) to the active thermal interposer device 200. For example, latches 255 may extend over a device under test and/or its socket, and lock it into place. Active thermal interposer device 200 may comprise alignment features 250, in some embodiments. Alignment features 250 may comprise fiducial alignment markings and/or receptacles, for example, micro-alignment bushings, e.g., alignment pin sockets 251, to assist and/or ensure alignment of active thermal interposer device 200 into a test stack, as described with respect to FIG. 1A.

In accordance with embodiments of the present invention, the socket, e.g., socket 105 of FIG. 1A, and/or active thermal interposer device 200 comprise features to prevent the active thermal interposer device 200 from making undesired electrical contact with electrical contacts of the socket if a device under test is not present. Such undesired contact may lead to detrimental voltages and/or currents from the active thermal interposer device 200 coupled into test equipment via the socket and/or physical damage to socket contacts. Locating contact pads 240 outside of a footprint of a DUT, e.g., outside of a socket, may help to prevent such undesired contact, in some embodiments.

In some embodiments, active thermal interposer device 200 may comprise a barcode 245, e.g., for identification purposes. Barcode 245 may comprise any suitable encoding, including two-dimensional barcodes, in accordance with embodiments of the present invention. Barcode 245 may uniquely identify a particular active thermal interposer device 200, in some embodiments. Uniquely identifying a particular active thermal interposer device 200 may allow calibration information for the particular active thermal interposer device 200 to be retried from a database and utilized during testing with the particular active thermal interposer device 200, in some embodiments. In some embodiments, barcode 245 may be utilized to record and track which particular active thermal interposer device 200 is used for testing with a particular socket, e.g., socket 105 of FIG. 1A, and/or is used for testing a particular device under test, e.g., DUT 110 of FIG. 1A.

In some embodiments, barcode 245 may encode calibration parameters, e.g., for thermal sensors, corresponding to a particular active thermal interposer device 200. For example, such encoding may eliminate a need to access a database to retrieve such information. Barcode 245 may be utilized to ensure that a correct active thermal interposer device 200 is selected, installed, and/or used for a particular test. For example, barcode 245 may be utilized to authorize and/or authenticate a particular active thermal interposer device for use in particular equipment and/or for use in a particular test. Barcode 245 may be read when an active thermal interposer device is picked up for placement, e.g., from a storage location, and/or when placed in a test stack. In some embodiments, the information encoded on barcode 245 may be encrypted. For example, information may be encrypted and then encoded by a standard barcode encoding.

Active thermal interposer device 200 may comprise a plurality of active thermal regions or zones 210, 215, 220, 225, 230 located in a body layer or formation of the device 200, in some embodiments. The body layer may be a single layer structure or a multi-layer structure or formation. In some embodiments, there may be a single thermal region. Each thermal region may correspond to a region of a device under test. For example, active thermal region 210 may correspond to a large die of a multi-chip module, which active thermal regions 215, 220, 225, and 230 correspond to other and/or smaller chips of the multi-chip module. In some embodiments, multiple thermal regions may correspond to a single die or chip. As used herein, the term "integrated circuit device" refers to devices, e.g. multi-chip modules, systems on a chip, and/or single semiconductors, that comprise at least one integrated circuit.

Each of active thermal regions 215, 220, 225, and 230 are configured to selectively apply thermal energy to a device under test, e.g., DUT 110 of FIG. 1A, during testing thereof. The active thermal regions 215, 220, 225, and 230 are also configured to selectively extract thermal energy from a device under test. The extraction of thermal energy may be via a coupling to a cold plate, e.g., cold plate 130 of FIG. 1A, and/or via a Peltier device within the active thermal regions 215, 220, 225, and 230. Each active thermal region may be independently controlled to a different temperature.

Figure 3:
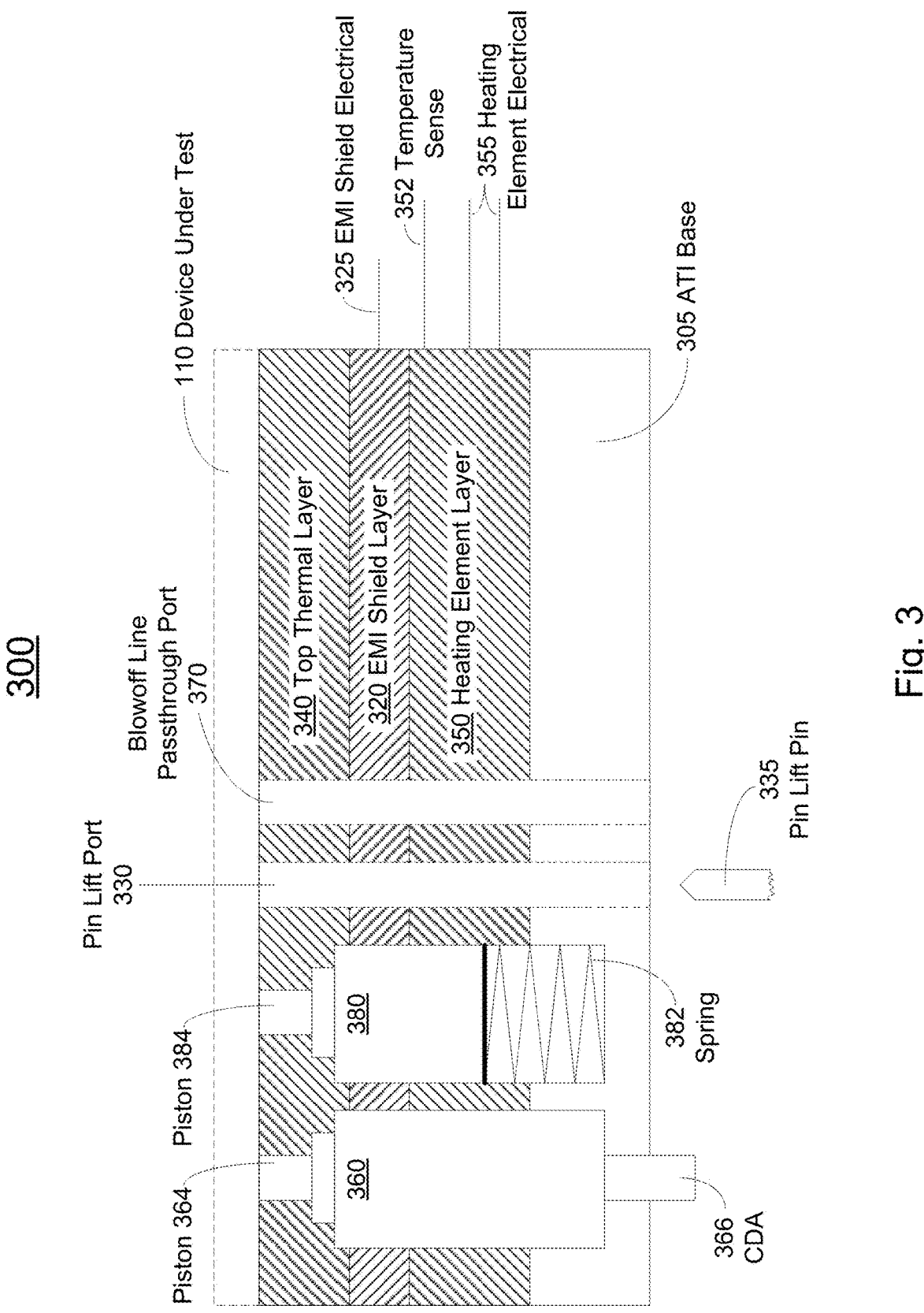
FIG. 3 illustrates an exemplary block diagram cross sectional view of a novel stand-alone active thermal interposer device, in accordance with embodiments of the present invention.

FIG. 3 illustrates an exemplary block diagram cross sectional view of a novel active thermal interposer device 300, in accordance with embodiments of the present invention. In the embodiment of FIG. 3, a device under test 110 is illustrated at the top of the active thermal interposer device 300. Device under test 110 is included for illustration, and is not a part of active thermal interposer device 300. Active thermal interposer device 300 comprises a heating element layer 350, mounted to or on an active thermal interposer device base 305. Heating element layer 350 comprises a plurality of heating elements configured to apply heat energy to device under test 110. The heating elements may comprise resistive traces or other suitable types of heaters. Active thermal interposer device 300 may also comprise cooling elements, e.g., Peltier devices, within heating element layer 350, in some embodiments. The plurality of heating and/or cooling elements are coupled to a plurality of electrical signals 355, for providing controlled power to the heating and/or cooling elements. Heating element layer 350 (body layer or formation) may include low resistance traces, e.g., from electrical signals 355 to the actual heating elements, in some embodiments. Heating element layer 350 also comprises one or more temperature measurement devices, e.g., thermocouples, (not shown), which are coupled to control elements via temperature a plurality of sense signals 352.

In accordance with embodiments of the present invention, active thermal interposer device 300 may comprise a novel electromagnetic interference (EMI) shield layer 320. Each of the plurality of heating elements in layer 350 may utilize currents of many tens of amperes, e.g., to generate heating of hundreds of watts during testing of a DUT. In accordance with embodiments of the present invention that utilize switching such currents to control temperature, e.g., pulse width modulation, such switching may induce unwanted electromagnetic noise signals that are deleterious to the operation and/or test of integrated circuits, e.g., device under test 110 of FIG. 1A, coupled to the active thermal interposer device 300. In some embodiments, EMI shield layer 320 comprises a solid layer of conductor, e.g., conductive traces similar to those utilized in heating element layer 350. In some embodiments, EMI shield layer 320 comprises a grid of conductive elements. The grid may be sized to attenuate desired wavelength(s) of electromagnetic interference. EMI shield layer 320 may have an electrical connection 325, e.g., to ground, in some embodiments.

Figure 5:
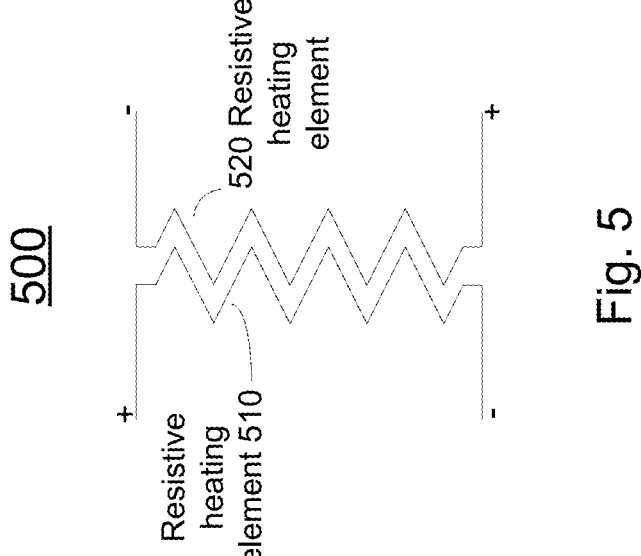
FIG. 5 illustrates a schematic of an exemplary heating element of a stand-alone active thermal interposer device, in accordance with embodiments of the present invention.

Referring now to FIG. 5, FIG. 5 illustrates a schematic of an exemplary heating element 500, in accordance with embodiments of the present invention. Heating element 500 is well suited to use in active thermal interposer device 120 (FIG. 1A). Heating element 500 may be powered by a voltage/current drive signal, and comprises two resistive heating elements 510 and 520. Heating elements 510 and 520 may comprise resistive traces on a ceramic substrate, in some embodiments. Heating elements 510 and 520 comprise resistive traces in a generally serpentine pattern, although the straight traces illustrated are not required. The traces may have a substantially curved nature, in some embodiments. Heating elements 510 and 520 are close together, for example, as close as allowed by design rules for the technology, including current carrying capacity and insulative separation requirements. Heating elements 510 and 520 may be operated together while phase reversed. For example, in the illustration of FIG. 5, current may flow from top to bottom in heating element 510, and from bottom to top in heating element 520. In this novel arrangement, electromagnetic fields generated by switching of currents within heating element 510 may be substantially canceled by inverted electromagnetic fields generated by switching of currents within heating element 520, reducing deleterious electromagnetic interference. If elements of heating elements 510 and 520 comprise parallel elements, capacitive coupling may be beneficial as well, e.g., reducing inductance in the resistive heating elements.

Referring once again to FIG. 3, active thermal interposer device 300 comprises a top thermal layer 340. Thermal layer 340 functions to couple heat energy from heating element layer 350 to a device under test and vice versa. Thermal layer 340 is non-conductive, in some embodiments. Thermal layer 340 should have a high degree of co-planarity in order to facilitate good thermal conduction to a device under test, in some embodiments.

Active thermal interposer device 300 should be compatible and complementary with conventional elements of integrated circuit test equipment. In some embodiments, active thermal interposer device 300 may comprise a blowoff line passthrough port 370. Blowoff line passthrough port 370 couples to a conventional blowoff line, as is typically used to break a seal or kick off a device under test, prior to removing the device under test from the test system. For example, blowoff line passthrough port 370 mates with a blowoff line port of a conventional cold plate, e.g., cold plate 130 of FIG. 1A. There may be a plurality of blowoff line passthrough ports 370 in an instance of active thermal interposer device 300, for example three arranged in an equilateral triangle, in some embodiments. A blowoff line passthrough port 370 typically extends through active thermal interposer device 300.

Active thermal interposer device 300 may also or alternatively comprise a device under test pin lift port 330, in some embodiments. Device under test pin lift port 330 may be aligned with a similar port or channel in a cold plate, e.g., cold plate 130 of FIG. 1A. Device under test pin lift port 330 enables a device under test lift pin 335 to raise a device under test above the top of the active thermal interposer device 300. The lift pin 335 typically extends from or through a cold plate, e.g., cold plate 130 of FIG. 1A, and/or from a chuck mechanism (not shown). In accordance with some embodiments of the present invention, the lift pin 335 may be lengthened, in contrast to a conventional lift pin, to account for the thickness of active thermal interposer device 300. There may be a plurality of pin lift ports 330 in an instance of active thermal interposer device 300, for example three arranged in an equilateral triangle, in some embodiments. A pin lift port 330 typically extends through active thermal interposer device 300.

Active thermal interposer device 300 may also or alternatively comprise a device under test air-powered kick off device 360. Kick off device 360 comprises a kick off piston 364 that selectively pushes against DUT 110 in response to pressure applied via compressed dry air (CDA) port 366. Active thermal interposer device 300 may also or alternatively comprise a device under test spring loaded kick off device 380. Device under test spring loaded kick off device 380 comprises a spring 382 that pushes piston 384 to push against DUT 110. A force exerted by spring 382 may be controlled, in some embodiments. For example, spring 382 may be constrained by a releasable latch mechanism, in some embodiments. In other embodiments, spring 382 may comprise memory wire, for example, which expands in response to an applied voltage. In some embodiments, spring 382 may not be controlled. For example, spring 382 may always apply a force against DUT 110. When, for example, a retention latch, e.g., latch 255 of FIG. 2, is released, spring 382 may act, forcing piston 384 against DUT 110, providing sufficient force to dislodge DUT 110 from active thermal interposer device 300.

Figure 4:
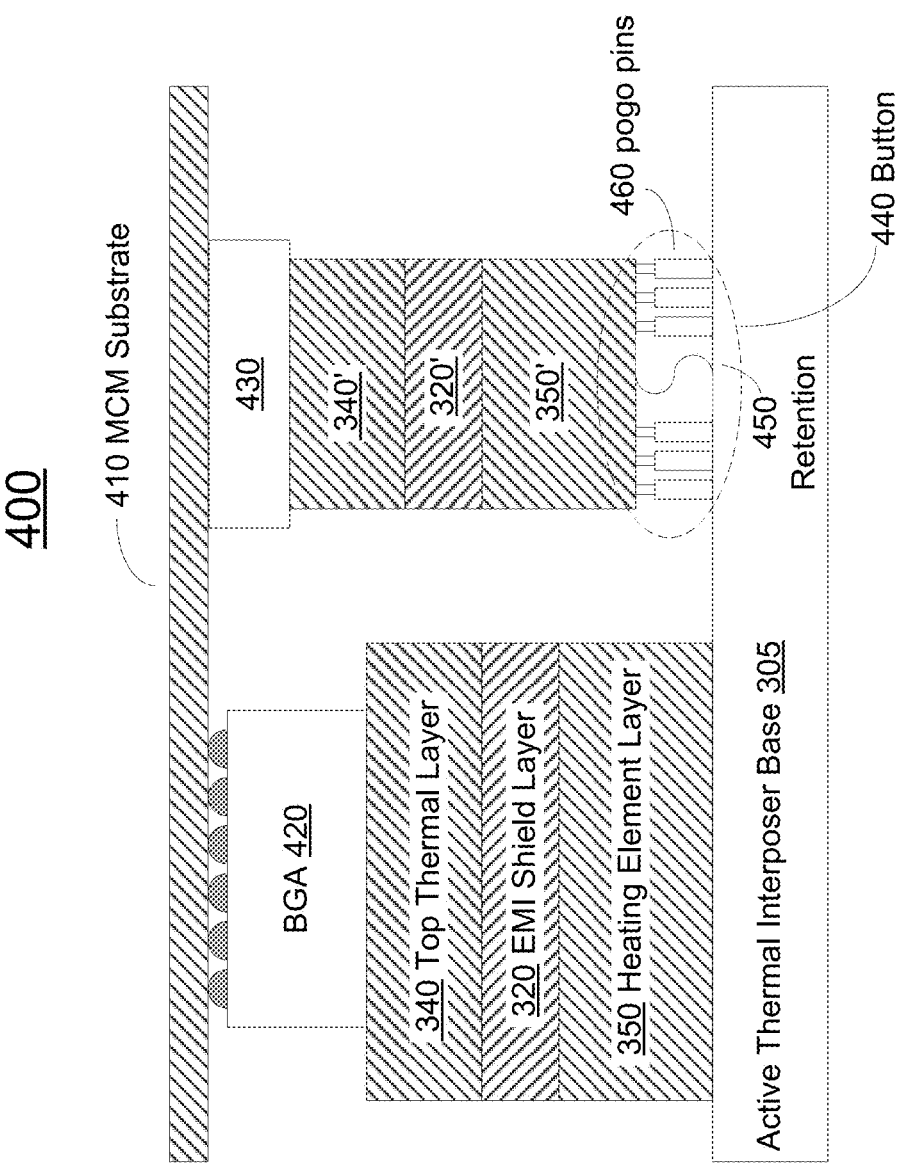
FIG. 4 illustrates an exemplary block diagram cross sectional view of a novel stand-alone active thermal interposer device, in accordance with embodiments of the present invention.

It is appreciated that multi-chip modules often comprise integrated circuit devices of differing heights or thickness. FIG. 4 illustrates an exemplary block diagram cross sectional view of a novel active thermal interposer device 400, in accordance with embodiments of the present invention. Active thermal interposer device 400 is configured to mechanically and thermally couple to a multi-chip module comprising integrated circuit devices of differing heights or thickness. FIG. 4 illustrates a multi-chip module device under test comprising a substrate 410, for example a printed wiring board or a ceramic substrate, an integrated circuit packaged in a ball grid array (BGA) 420, and another integrated circuit 430 packaged in a lower profile package, e.g., a plastic-leaded chip carrier (PLCC) or a "glop top" conformal coating. Package 420 is the tallest structure of the multi-chip module. Elements 410, 420 and 430 are illustrated for context, and are not a part of active thermal interposer device 400.

Elements 305, 350, 320 and 340 are as previously described with respect to FIG. 3, and may be described as or referred to as a test stack and/or thermal stack. Elements 350, 320 and 340 may correspond to thermal region 210 of FIG. 2, for example. Elements 350', 320', and 340' have corresponding functions to elements 350, 320 and 340, and may be described as or referred to as a (different) thermal stack. Elements 350', 320', and 340' may correspond to thermal region 230 of FIG. 2, for example. In general, elements 350', 320', and 340' may be the same thickness as the corresponding elements 350, 320 and 340, but that is not required. In contrast to elements 350, 320 and 340, elements 350', 320', and 340' are mounted on top of button 440. Button 440 comprises a plurality of pogo pins 460 and optional retention mechanism 450. Button 440 is configured to raise (in the configuration of FIG. 4) elements 350', 320' and 340' so that top thermal layer 340' is in good thermal contact with integrated circuit package 430.

The plurality of pogo pins 460 push heating element layer 350', EMI shield layer 320' and top thermal layer 340' up so that top thermal layer 340' is in good thermal contact with integrated circuit package 430. The plurality of pogo pins 460 also couple electrical signals to heating element 350' and EMI shield layer 320'. Optional retention mechanism 450 may keep elements 350', 320', and 340' from rising too far, for example, when a DUT is removed. It is appreciated that heating element layer 350' may comprise contact pads to couple with pogo pins 460. Heating element layer 350 may comprise similar pads, or may utilize a different mechanism to make electrical coupling(s) with a test apparatus, in embodiments. In accordance with embodiments of the present invention, a single active thermal interposer device may comprise multiple thermal stacks on multiple buttons at different heights.

Figure 6:
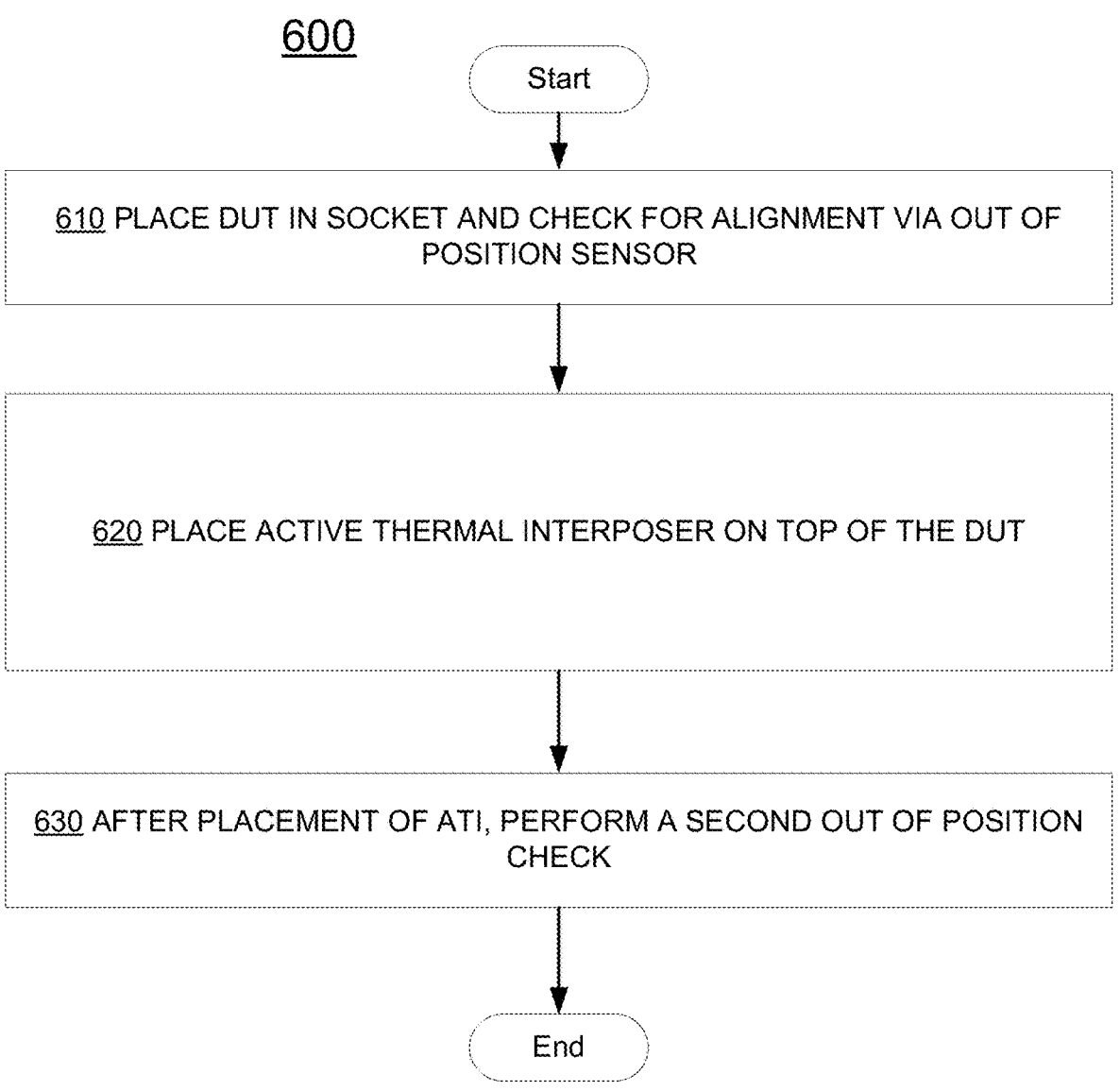
FIG. 6 illustrates an exemplary computer-controlled method for testing circuits of an integrated circuit semiconductor wafer, in accordance with embodiments of the present invention.

FIG. 6 illustrates an exemplary computer-controlled method 600 for testing circuits of an integrated circuit semiconductor wafer, in accordance with embodiments of the present invention. Method 600 may be practiced by test system 170 as described in FIG. 1D, in some embodiments. In 610, a handler device places a device under test, e.g., DUT 110 of FIG. 1A, into a socket, e.g., socket 105 of FIG. 1A, and checks if the DUT is aligned via an out of position (OOP) sensor. In 620, the handler places the active thermal interposer device, e.g., active thermal interposer device 120 of FIG. 1A, on top of the DUT. The alignment features in the socket and on the active thermal interposer device, e.g., 250 of FIG. 2, assist in placing the active thermal interposer device on top of the DUT. In 630, after the active thermal interposer device is placed, a second OOP check is performed to ensure that the active thermal interposer device is placed in a planar fashion and is not tilted or otherwise misaligned.

Figure 7:
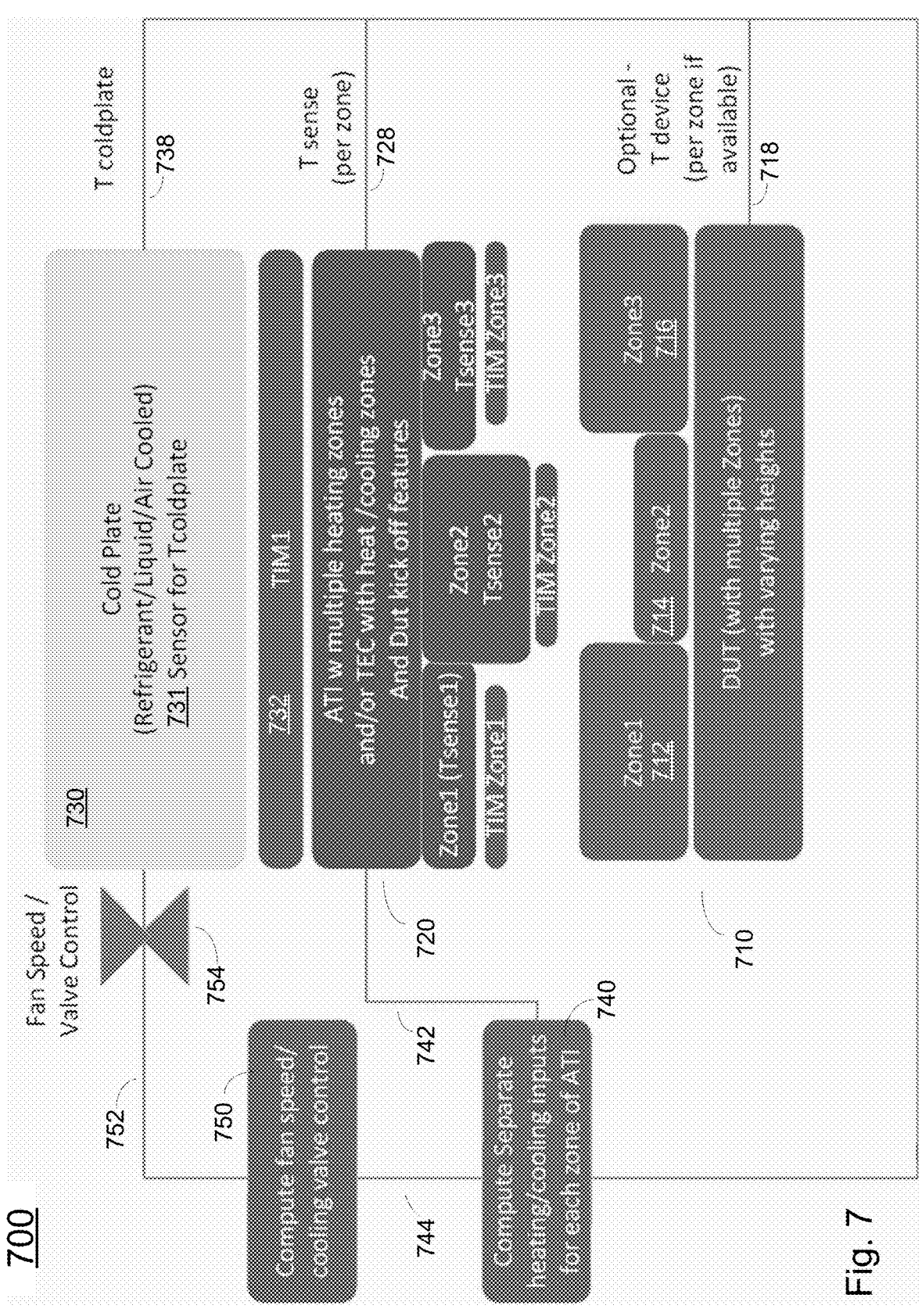
FIG. 7 is an exemplary block diagram of a control system for thermal control of a plurality of devices under test, in accordance with embodiments of the present invention.

FIG. 7 is an exemplary block diagram of a control system 700 for thermal control of a plurality of devices under test, in accordance with embodiments of the present invention. The control elements of control system 700, e.g., active thermal interposer device heating/cooling control 740 and/or cold plate control 750, may correspond to thermal controller 145 of FIG. 1A, in some embodiments. Device under test (DUT) 710 may have multiple zones of varying heights for temperature control, for example, zone 1 712, zone 2 714, and zone 3 716. An on-chip and/or in-package temperature measurement 718 is accessed, if available. In some embodiments, a temperature measurement from one or more temperature sensors on a load board may be accessed. It is desirable to access an on-chip, in-package, and/or load board temperature measurement corresponding to each zone. Any suitable on-chip, in-package, and/or load board temperature measurement device(s) may be utilized, e.g., a band gap, a ring oscillator, and/or a thermocouple.

Active thermal interposer device 720 is thermally coupled to device under test 710. Active thermal interposer device 720 comprises multiple heating and/or cooling zones to correspond to the multiple zones of device under test 710. In some embodiments, some heating and/or cooling zones of active thermal interposer device 720 may be mounted on buttons to account for different heights of the multiple zones of device under test 710, as previously described with respect to FIG. 4. A temperature measurement of cold plate 730 and one or more temperature measurements of each active thermal interposer device zone may be accessed at 738, 728, and/or 718.

Active thermal interposer device 720 is thermally coupled to a cold plate, e.g., cold plate 130 of FIG. 1A, e.g., via thermal interface material 732. A temperature measurement 738 of cold plate 730 made by cold plate temperature sensor 731 is accessed.

The several temperature measurements, e.g., 718, 728, 738 are inputs to active thermal interposer device heating/cooling control 742. Control 740 generates one or more control outputs for each zone of active thermal interposer device 720 to achieve a desired temperature for each of such zones. Control 740 also produces an output 744 that is input to cold plate control 750. Cold plate control 750 is configured to achieve a desired temperature of cold plate 730. Cold plate control 750 outputs a control signal 752 that controls operation of fan speed and/or coolant valve 754.

In accordance with embodiments of the present invention, one or both of active thermal interposer device heating/cooling control 740 and/or cold plate control 750 may utilize dual loop proportional-integral-derivative (PID) algorithms that are configured to utilize both heating and cooling elements to control a desired temperature for each zone of the device under test 710. For example, a first control loop may control a fan speed (for air control) and/or a fluid regulation valve (for liquid/refrigerant control) of the cold plate to control a temperature of the cold plate 730 as measured by cold plate temperature sensor 731. A second control loop may operate relatively faster than the first control loop to control temperatures of each zone of active thermal interposer device 720. As previously presented, each zone of active thermal interposer device 720 may comprise heating and cooling elements, in some embodiments.

In accordance with embodiments of the present invention, it may be beneficial to place thermal resistance structures between some or all of active thermal regions or zones, e.g., thermal regions or zones 210, 215, 220, 225, 230 as illustrated in FIG. 2. Such thermal resistance structures decrease heat conduction among thermal zones. For example, a thermal resistance structure may reduce or inhibit thermal conduction from thermal region 210 to thermal region 220 (FIG. 2). The thermal resistance structures may improve the capability of maintaining different temperatures in different thermal regions of an active thermal interposer device. In some embodiments, firmware may perform all or portions of such control loop(s).

Figure 8:
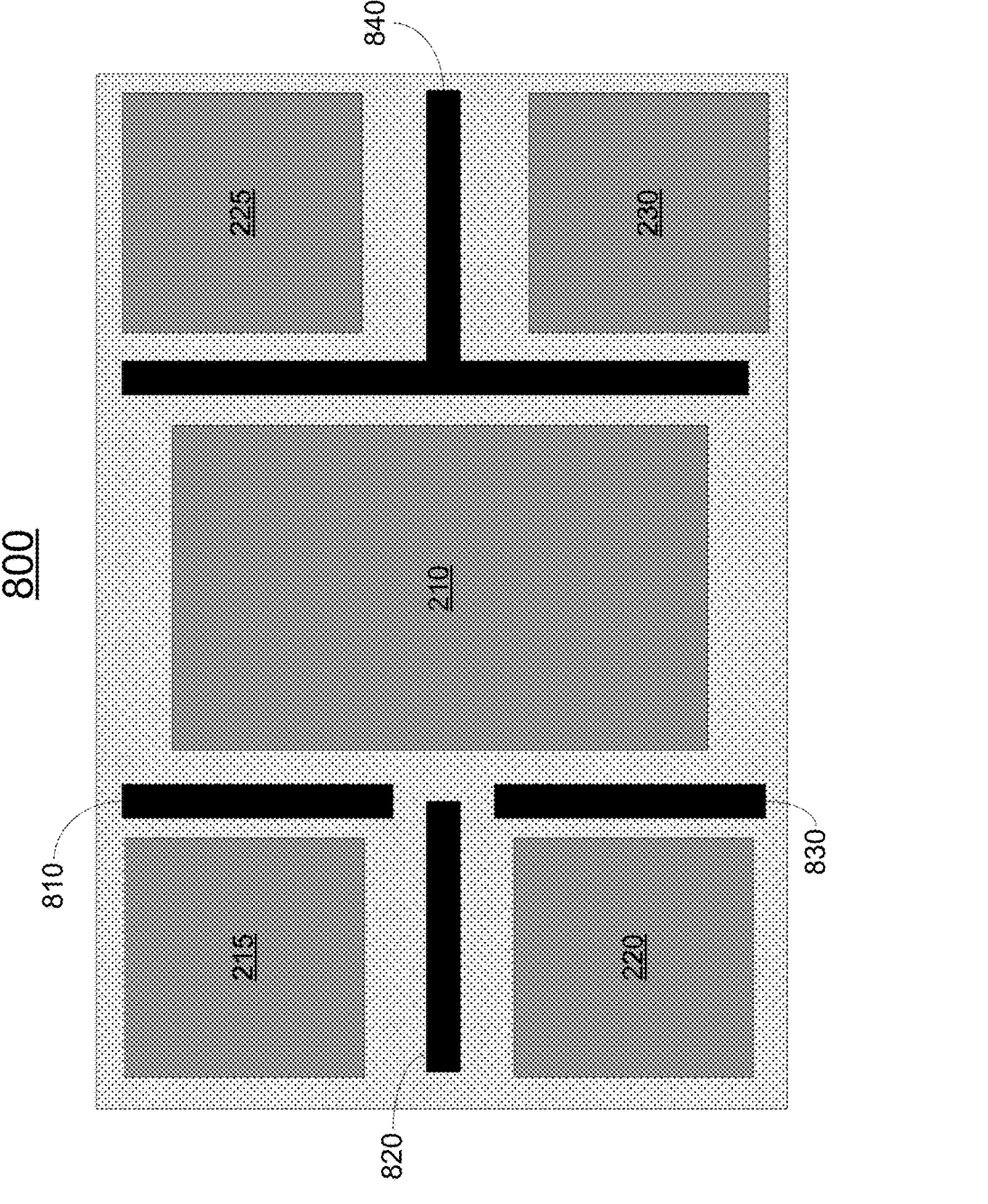
FIG. 8 illustrates an exemplary block diagram of a novel active thermal interposer device with thermal isolation structures.

FIG. 8 illustrates an exemplary block diagram of a novel stand-alone active thermal interposer device 800 with thermal isolation structures, in accordance with embodiments of the present invention. Active thermal interposer device with thermal isolation 800 is generally similar to active thermal interposer device 200 of FIG. 2, with the addition of thermal resistance structures disposed in the body layer and positioned between the thermal regions. The thermal resistance structures are operable to thermally isolate the various thermal regions or zones of the stand-alone active thermal interposer device 800.

In addition to the features of active thermal interposer device 200, active thermal interposer device with thermal isolation 800 comprises a plurality of thermal resistance structures, e.g., exemplary thermal resistance structures 810, 820, 830, and 840. Exemplary thermal resistance structures 810, 820, 830, and 840 function to limit a flow of thermal energy from one thermal region, e.g., thermal region 210, to one or more other thermal regions, e.g., thermal region 215 so that the various thermal regions can be independently thermally controlled. The plurality of thermal resistance structures may be continuous, e.g., as illustrated in exemplary thermal resistance structure 840, or discontinuous, as illustrated in exemplary thermal resistance structures 810, 820, and 830. Although illustrated in generally rectilinear form (in plan view), thermal resistance structures may have any suitable shape, including curve segments, zig-zag patterns, serpentine patterns, and the like, in accordance with embodiments of the present invention.

Figure 9B:
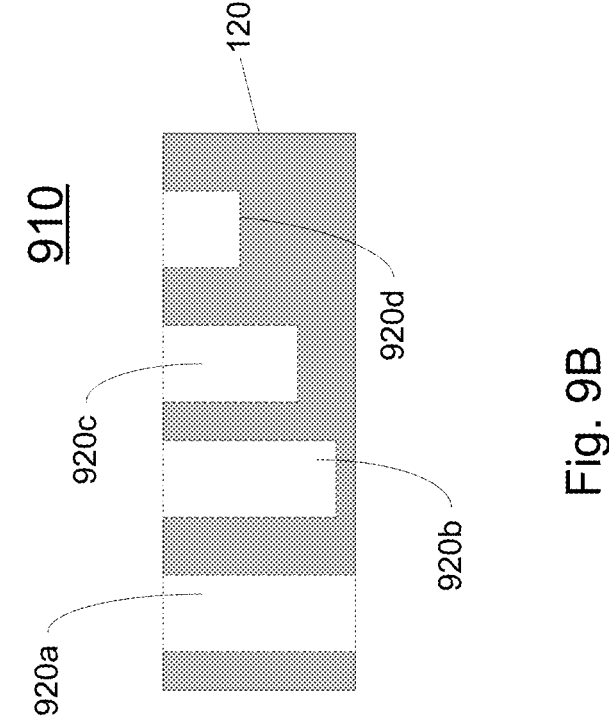
FIG. 9B illustrates a side-sectional view of an exemplary embodiment of a thermal resistance structure, in accordance with embodiments of the present invention.
Figure 9A:
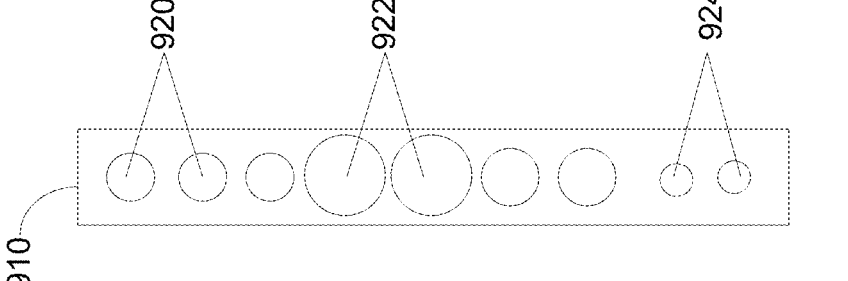
FIG. 9A illustrates a plan view of an exemplary embodiment of a thermal resistance structure, in accordance with embodiments of the present invention.

FIG. 9A illustrates a plan view of an exemplary embodiment of a thermal resistance structure, e.g., thermal resistance structure 910, in accordance with embodiments of the present invention. Thermal resistance structure 910 may correspond to one or more of thermal resistance structures 810, 820, 830 and/or 840 (FIG. 8). Thermal resistance structure 910 comprises a plurality of holes 920, 922, 924 made in the body layer. The holes 920, 922, 924 may be formed completely or partially through an active thermal interposer device, in accordance with embodiments of the present invention. For example, the holes 920, 922, 924 may be formed completely or partially through some or all of layers 340, 320, 350 and/or 305 (FIG. 3) of an active thermal interposer device. Although holes 920 are illustrated in plan view as having circular cross sections, this is not required. In accordance with embodiments of the present invention, holes 920, 922, 924 may have any suitable cross section, including non-regular and/or non-symmetrical cross sections. The plurality of holes 920, 922, 924 may have different cross-sectional shapes, in embodiments.

For example, if holes 920, 922, 924 are formed by subtractive manufacturing methods, e.g., drilling, holes comprising circular cross section may be more straightforward to produce. If holes 920, 922, 924 are formed during additive manufacturing processes, other hole shapes, e.g., rectangular or polygonal cross sections, may be advantageous to such manufacturing processes. Embodiments in accordance with the present invention are well suited to all such manufacturing processes.

Holes 920, 922, 924 may have any suitable diameter and/or cross-sectional area, in accordance with embodiments of the present invention. The holes 920, 922, 924 may have any suitable spacing, including non-regular spacing, from one another. For example, holes 922 are illustrated as being closer together than holes 924. In accordance with embodiments of the present invention, holes 920, 922, 924 may have greater cross-sectional area and/or closer spacing in one portion of thermal resistance structure 910 than in other portions of thermal resistance structure 910. For example, holes 922 are illustrated as having a larger cross sectional area than holes 924. In this novel manner, a thermal resistance of thermal resistance structure 910 may be varied across the extent of thermal resistance structure 910.

In some embodiments, conductive elements of EMI shield layer 320 may be routed in between holes 920, 922, 924 to maintain continuity of an EMI shield layer between separate thermal regions. In some embodiments, EMI shield layer 320 may be segmented in a manner similar to and corresponding to the thermal separation of thermal regions or zones 210, 215, 220, 225, 230 as illustrated in FIG. 2. Each such segment of EMI shield layer 320 may be coupled to another segment of EMI shield layer 320 and/or ground via conductors outside of active thermal interposer device 120 (FIG. 1A).

FIG. 9B illustrates a side-sectional view of an exemplary embodiment of a thermal resistance structure 910, in accordance with embodiments of the present invention. FIG. 9B illustrates a variety of possible holes 920, e.g., holes 920a, 920b, 920c, and 920d. Embodiments in accordance with the present invention may comprise holes completely or partially through some or all of layers 340, 320, 350 and/or 305 (FIG. 3) of an active thermal interposer device. For example, hole 920a is formed completely through active thermal interposer device 120 (FIG. 1A). Holes 920b, 920c, and 920d are formed partially through portions, e.g., layers, of active thermal interposer device 120. In some embodiments, all holes 920 may be formed to a same depth into an active thermal interposer device. In some embodiments, holes 920 may be formed to differing depths into the body layer of active thermal interposer device.

Figure 10:
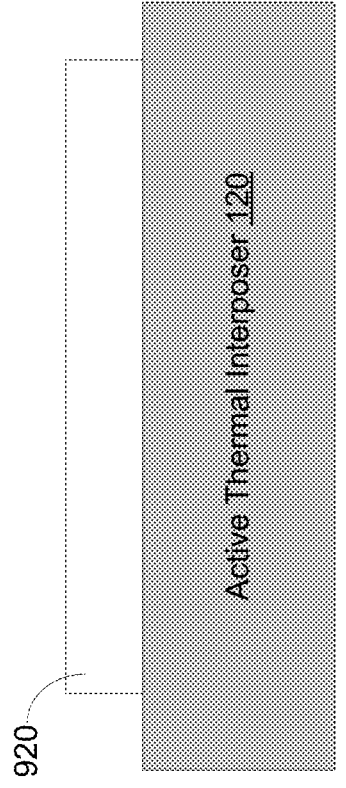
FIG. 10 illustrates a side-sectional view of an exemplary embodiment of a thermal resistance structure, in accordance with embodiments of the present invention.

FIG. 10 illustrates a side-sectional view of an exemplary embodiment of a thermal resistance structure, e.g., thermal resistance structure 920, in accordance with embodiments of the present invention. Thermal resistance structure 920 is a "wall-like" structure formed and/or raised above a main body of an active thermal interposer, e.g., active thermal interposer device 120 (FIG. 1A). In some embodiments, thermal resistance structure 920 comprises the same material(s) at active thermal interposer device 120.

For example, it is known to form a thermal interposer from multiple, e.g., eight, layers of aluminum nitrite (AlN), which are subsequently pressed together and sintered. If active thermal interposer device 120 is formed via a layering process, thermal resistance structure 920 may be formed by additional layers in its region. In some embodiments, thermal resistance structure 920 may be added to active thermal interposer device 120 in additional operation(s) after manufacture of a main portion of active thermal interposer device 120.

Embodiments of FIG. 10 may generally extend from a device under test side of active thermal interposer device 120, although that is not required. The height of thermal resistance structure 920 may be limited to avoid interference with structures of a device under test, and/or to allow elements of the active thermal interposer device 120 and/or thermal interface material, to contact elements of the device under test. Exemplary heights for thermal resistance structure 920 may in the range of 1 to 10 mm above a surface of active thermal interposer device 120, in embodiments.

FIGS. 11A and 11B illustrate side-sectional views of an exemplary embodiment of a thermal resistance structure, e.g., thermal resistance structure 930*a-b*, shaped as a trench or trench like structure, in accordance with embodiments of the present invention. Thermal resistance structure 930*a-b* may be shaped as a trench formed completely or partially through an active thermal interposer device, in accordance with embodiments of the present invention. For example, thermal resistance structure 930*c* may be a trench like structure formed completely or partially through some or all of layers 340, 320, 350 and/or 305 (FIG. 3) of an active thermal interposer device. In contrast to the exemplary embodiments of FIGS. 9A and 9B, thermal resistance structure 930*c* comprises a single "trench" or continuous narrow channel, whereas FIGS. 9A and 9B illustrate a plurality of separate holes. Generally, the term trench is used to mean or refer to a void of material, e.g., a hole or ditch. Generally, the length of such a trench is much greater than its width or depth.

FIG. 11A illustrates a side-sectional view of an exemplary embodiment of a thermal resistance structure, e.g., thermal resistance structure 930*a*, in accordance with embodiments of the present invention. Thermal resistance structure 930*a* comprises a trough, trench, or long hole inside a body layer of active thermal interposer device 120 (FIG. 1A). Thermal resistance structure 930*a* does not extend completely through active thermal interposer device 120. For embodiments of a thermal resistance structure, e.g., thermal resistance structure 930*a*, that do not extend completely through active thermal interposer device 120, such embodiments may start at either face of active thermal interposer device 120, e.g., a first face configured to be close to a device under test, or an opposite face, configured to be disposed away from a device under test.

FIG. 11B illustrates a side-sectional view of an exemplary embodiment of a thermal resistance structure, e.g., thermal resistance structure 930*b*, in accordance with embodiments of the present invention. Thermal resistance structure 930*b* comprises a trough, trench, or long hole inside active thermal interposer device 120 (FIG. 1A). Thermal resistance structure 930*b* extends completely through active thermal interposer device 120. In some embodiments, a thermal resistance structure, e.g., thermal resistance structure 930*c*, may not extend to either face of active thermal interposer device 120, as illustrated in FIG. 11C.

In some embodiments, conductive elements of EMI shield layer 320 may be routed in between thermal resistance structures 930*a*, 930*b*, and/or 930*c*, to maintain continuity of an EMI shield layer between separate thermal regions. In some embodiments, EMI shield layer 320 may be segmented in a manner similar to and corresponding to the thermal separation of thermal regions or zones 210, 215, 220, 225, 230 as illustrated in FIG. 2. Each such segment of EMI shield layer 320 may be coupled to another segment of EMI shield layer 320 and/or ground via conductors outside of active thermal interposer device 120 (FIG. 1A).

FIG. 12 illustrates a block diagram of an exemplary electronic system 1200, which may be used as a platform to implement and/or as a control system, e.g., thermal controller, for embodiments of the present invention. Electronic system 1200 may be a "server" computer system, in some embodiments. Electronic system 1200 includes an address/data bus 1250 for communicating information, a central processor complex 1205 functionally coupled with the bus for processing information and instructions. Bus 1250 may comprise, for example, a Peripheral Component Interconnect Express (PCIe) computer expansion bus, industry standard architecture (ISA), extended ISA (EISA), MicroChannel, Multibus, IEEE 796, IEEE 1196, IEEE 1496, PCI, Computer Automated Measurement and Control (CAMAC), MBus, Runway bus, Compute Express Link (CXL), and the like.

Central processor complex 1205 may comprise a single processor or multiple processors, e.g., a multi-core processor, or multiple separate processors, in some embodiments. Central processor complex 1205 may comprise various types of well known processors in any combination, including, for example, digital signal processors (DSP), graphics processors (GPU), complex instruction set (CISC) processors, reduced instruction set (RISC) processors, and/or very long word instruction set (VLIW) processors. Electronic system 1200 may also includes a volatile memory 1215 (e.g., random access memory RAM) coupled with the bus 1250 for storing information and instructions for the central processor complex 1205, and a non-volatile memory 1210 (e.g., read only memory ROM) coupled with the bus 1250 for storing static information and instructions for the processor complex 1205. Electronic system 1200 also optionally includes a changeable, non-volatile memory 1220 (e.g., NOR flash) for storing information and instructions for the central processor complex 1205 which can be updated after the manufacture of system 1200. In some embodiments, only one of ROM 1210 or Flash 1220 may be present.

Also included in electronic system 1200 of FIG. 12 is an optional input device 1230. Device 1230 can communicate information and command selections to the central processor 1200. Input device 1230 may be any suitable device for communicating information and/or commands to the electronic system 1200. For example, input device 1230 may take the form of a keyboard, buttons, a joystick, a track ball, an audio transducer, e.g., a microphone, a touch sensitive digitizer panel, eyeball scanner, and/or the like.

Electronic system 1200 may comprise a display unit 1225. Display unit 1225 may comprise a liquid crystal display (LCD) device, cathode ray tube (CRT), field emission device (FED, also called flat panel CRT), light emitting diode (LED), plasma display device, electro-luminescent display, electronic paper, electronic ink (e-ink) or other display device suitable for creating graphic images and/or alphanumeric characters recognizable to the user. Display unit 1225 may have an associated lighting device, in some embodiments.

Electronic system 1200 also optionally includes an expansion interface 1235 coupled with the bus 1250. Expansion interface 1235 can implement many well known standard expansion interfaces, including without limitation the Secure Digital Card interface, universal serial bus (USB) interface, Compact Flash, Personal Computer (PC) Card interface, CardBus, Peripheral Component Interconnect (PCI) interface, Peripheral Component Interconnect Express (PCI Express), mini-PCI interface, IEEE 8394, Small Computer System Interface (SCSI), Personal Computer Memory Card International Association (PCMCIA) interface, Industry Standard Architecture (ISA) interface, RS-232 interface, and/or the like. In some embodiments of the present invention, expansion interface 1235 may comprise signals substantially compliant with the signals of bus 1250.

A wide variety of well-known devices may be attached to electronic system 1200 via the bus 1250 and/or expansion interface 1235. Examples of such devices include without limitation rotating magnetic memory devices, flash memory devices, digital cameras, wireless communication modules, digital audio players, and Global Positioning System (GPS) devices.

System 1200 also optionally includes a communication port 1240. Communication port 1240 may be implemented as part of expansion interface 1235. When implemented as a separate interface, communication port 1240 may typically be used to exchange information with other devices via communication-oriented data transfer protocols. Examples of communication ports include without limitation RS-232 ports, universal asynchronous receiver transmitters (UARTs), USB ports, infrared light transceivers, ethernet ports, IEEE 8394, and synchronous ports.

System 1200 optionally includes a network interface 1260, which may implement a wired or wireless network interface. Electronic system 1200 may comprise additional software and/or hardware features (not shown) in some embodiments.

Various modules of system 1200 may access computer readable media, and the term is known or understood to include removable media, for example, Secure Digital ("SD") cards, CD and/or DVD ROMs, diskettes and the like, as well as non-removable or internal media, for example, hard drives, solid state drive s (SSD), RAM, ROM, flash, and the like.

Embodiments in accordance with the present invention provide systems and methods for active thermal interposer devices. In addition, embodiments in accordance with the present invention provide systems and methods for active thermal interposer devices with thermal isolation operable to control different portions of a device under test to different temperatures. Further, embodiments in accordance with the present invention provide systems and methods for active thermal interposer devices with thermal isolation operable to control different portions of a device under test at different heights to different temperatures. Still further, embodiments in accordance with the present invention provide systems and methods for active thermal interposer devices with thermal isolation that are compatible and complementary with existing systems and methods of testing integrated circuits.

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

In sum, the disclosed techniques overcome the limitations of traditional methods by incorporating thermal resistance structures into an active thermal interposer device. The thermal resistance structures limit heat flow from one region to another region of the active thermal interposer device. A thermal interposer device may have multiple thermal regions. Each such thermal region may correspond to areas of a device under test. The individual areas of the device under test may be controlled to different temperatures by independent control the thermal regions of the active thermal interposer device. The thermal resistance structures impede heat flow from one region to another region of the active thermal interposer device that might interfere with the independent control the thermal regions of the active thermal interposer device. The thermal resistance structures may take a form of holes, trenches, and/or walls, in some embodiments.

At least one technical advantage of the disclosed techniques is that temperatures of different areas of a device under test are better controlled in comparison to the conventional art. Another technical advantage of the disclosed techniques is that less unwanted heat flows from one region of an active thermal interposer device to another region. The disclosed techniques further offer enhanced testing flexibility of testing different portions, e.g., different chips of a multi-chip module, of a device under test at different temperatures.

1. In some embodiments, an active thermal interposer (ATI) device for testing a device under test (DUT) comprises a formation comprising one or more layers, said formation comprising a first thermal zone, and a second thermal zone, said first thermal zone configured to apply thermal energy to a first thermal region of said DUT, and wherein said DUT is an integrated circuit device, said second thermal zone configured to apply thermal energy to a second thermal region of said DUT, wherein said second thermal zone is configured to control a temperature of said second thermal region of said DUT independently of a temperature of said first thermal region of said DUT, wherein further said first thermal zone is configured to control said temperature of said first thermal region of said DUT independently of said temperature of said second thermal region of said DUT, and a thermal resistance structure, disposed in said formation and located between said first thermal zone and said second thermal zone, said thermal resistance structure configured to limit conductance of thermal energy therebetween.

2. The ATI device of clause 1 wherein said thermal resistance structure comprises a trench formed in said formation and located between said first thermal zone and said second thermal zone.

3. The ATI device of clauses 1 or 2 wherein said trench is formed through all layers of said formation.

4. The ATI device of clauses 1 or 2 wherein said trench is formed through fewer than all layers of said formation.

5. The ATI device of clause 1 further comprising an EMI shield layer.

6. The ATI device of clause 1 wherein said thermal resistance structure comprises a portion raised above a surface of said formation.

7. The ATI device of clause 6 wherein said thermal resistance structure comprises a same material as a surface of said formation.

8. The ATI device of clause 1 wherein said thermal resistance structure comprises a plurality of substantially similar holes formed in said formation.

9. The ATI device of clause 8 further comprising an EMI shield layer comprising conductive elements disposed in areas between said plurality of substantially similar holes.

10. In some embodiments, a testing device for testing an integrated circuit device under test (DUT) comprises a stand-alone active thermal interposer device for use in testing said DUT and for coupling with a thermal controller, said stand-alone active thermal interposer device comprising a body layer having a first surface and a second surface, wherein said first surface is operable to be disposed adjacent to a cold plate, and a plurality of heating zones defined across a second surface of said body layer, said plurality of heating zones operable to be controlled by said thermal controller to selectively heat and maintain respective temperatures thereof, said plurality of heating zones operable to heat a plurality of areas of said DUT when said second surface of said body layer is disposed adjacent to an interface surface of said DUT during said testing of said DUT, and a plurality of thermal resistance structures formed in said body layer and operable to resist thermal conductance between the plurality of heating zones.

11. The testing device of clause 10 further comprising a thermal head for coupling to the thermal controller and operable to interface with said stand-alone active thermal interposer device during said testing of said DUT, said thermal head comprising said cold plate, and an insulation cover for insulating said cold plate, wherein said insulation cover comprises an injection port for reducing condensation from said cold plate.

12. The testing device of clause 10 wherein said plurality of thermal resistance structures comprises a plurality of trenches formed in said body layer and located between said plurality of heating zones.

13. The testing device of clauses 10-12 wherein said plurality of thermal resistance structures comprises portions raised above a surface of said body layer.

14. The testing device of clauses 10-13 wherein said plurality of thermal resistance structures comprises a same material as said body layer.

15. The testing device of clause 10 wherein said plurality of thermal resistance structures comprises a plurality of substantially similar holes formed in said body layer.

16. The testing device of clause 10 further comprising a system of cooling to remove heat from said cold plate.

17. The testing device of clause 10 further comprising a thermal interface material layer disposed between said stand-alone active thermal interposer device and said cold plate for coupling thermal energy from said stand-alone active thermal interposer device to said cold plate.

18. The testing device of clause 10 wherein said plurality of heating zones comprise resistive heaters.

19. In some embodiments, a testing arrangement for testing an integrated circuit device under test (DUT) comprises a socket device for containing said DUT and for interfacing with a load board, stand-alone active thermal interposer device for use in testing said DUT, said stand-alone active thermal interposer device comprising a body layer having a first surface and a second surface, wherein said first surface is operable to be disposed adjacent to a cold plate, and a plurality of heating zones defined across a second surface of said body layer, said plurality of heating zones operable to be controlled to selectively heat and maintain respective temperatures thereof, said plurality of heating zones operable to heat a plurality of areas of the DUT when said stand-alone active thermal interposer device is inserted into said socket device and said second surface of said body layer is disposed adjacent to an interface surface of said DUT, and wherein said body layer comprises a plurality of thermal resistance structures configured to resist thermal conductance between the plurality of heating zones.

20. The testing arrangement of clause 19 further comprising a thermal head operable to interface with said stand-alone active thermal interposer device during said testing of said DUT, said thermal head comprising said cold plate, and a thermal controller for coupling with said stand-alone active thermal interposer device to control said plurality of heating zones and to control said cold plate, said thermal controller comprising firmware operable to perform thermal regulation during testing of said DUT.

21. The testing arrangement of clause 20, wherein said firmware is further operable to obtain first temperatures which are of said cold plate from a temperature sensor of said cold plate, obtain second temperatures of the second surface of the stand-alone active thermal interposer device for each heating zone thereof using respective resistance temperature detectors, obtain third temperatures of each area of the DUT provided the DUT is active and circuitry on the load board is operable to collect a junction temperature for each area of the DUT, based on the first temperatures, perform an outer slower loop to regulate a fan speed of the cold plate, and based on the second and third temperatures, perform an inner faster loop to regulate heater control of the plurality of heating zones of the stand-alone active thermal interposer device.

22. The testing arrangement of clause 19 wherein said plurality of thermal resistance structures comprises a plurality of trenches formed in said body layer and located between said plurality of heating zones.

23. The testing arrangement of clause 19 wherein said plurality of thermal resistance structures comprises portions raised above a surface of said body layer.

24. The testing arrangement of clause 23 wherein said plurality of thermal resistance structures comprises a same material as said body layer.

25. The testing arrangement of clause 19 wherein said plurality of thermal resistance structures comprises a plurality of substantially similar holes formed in said body layer.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. While the preceding is directed to embodiments of the present disclosure, other and further embodiments of the disclosure may be devised without departing from the basic scope thereof, and the scope thereof is determined by the claims that follow.

We claim:

1. An active thermal interposer (ATI) device for testing a device under test (DUT), said ATI device comprising:
   a formation comprising one or more layers, said formation comprising: a first thermal zone; and a second thermal zone;
   said first thermal zone configured to apply thermal energy to a first thermal region of said DUT, and wherein said DUT is an integrated circuit device;
   said second thermal zone configured to apply thermal energy to a second thermal region of said DUT,
   wherein said second thermal zone is configured to control a temperature of said second thermal region of said DUT independently of a temperature of said first thermal region of said DUT,
   wherein further said first thermal zone is configured to control said temperature of said first thermal region of said DUT independently of said temperature of said second thermal region of said DUT; and
   a thermal resistance structure, disposed in said formation and located between said first thermal zone and said second thermal zone, said thermal resistance structure configured to limit conductance of thermal energy therebetween.

2. The ATI device of claim 1 wherein said thermal resistance structure comprises a trench formed in said formation and located between said first thermal zone and said second thermal zone.

3. The ATI device of claim 2 wherein said trench is formed through all layers of said formation.

4. The ATI device of claim 2 wherein said trench is formed through fewer than all layers of said formation.

5. The ATI device of claim 1 further comprising an EMI shield layer.

6. The ATI device of claim 1 wherein said thermal resistance structure comprises a portion raised above a surface of said formation.

7. The ATI device of claim 6 wherein said thermal resistance structure comprises a same material as a surface of said formation.

8. The ATI device of claim 1 wherein said thermal resistance structure comprises a plurality of substantially similar holes formed in said formation.

9. The ATI device of claim 8 further comprising an EMI shield layer comprising conductive elements disposed in areas between said plurality of substantially similar holes.

10. A testing device for testing an integrated circuit device under test (DUT), said testing device comprising:
    a stand-alone active thermal interposer device for use in testing said DUT and for coupling with a thermal controller, said stand-alone active thermal interposer device comprising:
    a body layer having a first surface and a second surface, wherein said first surface is operable to be disposed adjacent to a cold plate; and
    a plurality of heating zones defined across a second surface of said body layer, said plurality of heating zones operable to be controlled by said thermal controller to selectively heat and maintain respective temperatures thereof, said plurality of heating zones operable to heat a plurality of areas of said DUT when said second surface of said body layer is disposed adjacent to an interface surface of said DUT during said testing of said DUT; and a plurality of thermal resistance structures formed in said body layer and operable to resist thermal conductance between the plurality of heating zones.

11. The testing device of claim 10 further comprising a thermal head for coupling to the thermal controller and operable to interface with said stand-alone active thermal interposer device during said testing of said DUT, said thermal head comprising:

said cold plate; and an insulation cover for insulating said cold plate, wherein said insulation cover comprises an injection port for reducing condensation from said cold plate.

12. The testing device of claim 10 wherein said plurality of thermal resistance structures comprises a plurality of trenches formed in said body layer and located between said plurality of heating zones.

13. The testing device of claim 10 wherein said plurality of thermal resistance structures comprises portions raised above a surface of said body layer.

14. The testing device of claim 13 wherein said plurality of thermal resistance structures comprises a same material as said body layer.

15. The testing device of claim 10 wherein said plurality of thermal resistance structures comprises a plurality of substantially similar holes formed in said body layer.

16. The testing device of claim 10 further comprising a system of cooling to remove heat from said cold plate.

17. The testing device of claim 10 further comprising a thermal interface material layer disposed between said stand-alone active thermal interposer device and said cold plate for coupling thermal energy from said stand-alone active thermal interposer device to said cold plate.

18. The testing device of claim 10 wherein said plurality of heating zones comprise resistive heaters.

19. A testing arrangement for testing an integrated circuit device under test (DUT), said testing arrangement comprising:

a socket device for containing said DUT and for interfacing with a load board;

a stand-alone active thermal interposer device for use in testing said DUT, said stand-alone active thermal interposer device comprising:

a body layer having a first surface and a second surface, wherein said first surface is operable to be disposed adjacent to a cold plate; and a plurality of heating zones defined across a second surface of said body layer, said plurality of heating zones operable to be controlled to selectively heat and maintain respective temperatures thereof, said plurality of heating zones operable to heat a plurality of areas of the DUT when said stand-alone active thermal interposer device is inserted into said socket device and said second surface of said body layer is disposed adjacent to an interface surface of said DUT; and wherein said body layer comprises a plurality of thermal resistance structures configured to resist thermal conductance between the plurality of heating zones.

20. The testing arrangement of claim 19 further comprising:

a thermal head operable to interface with said stand-alone active thermal interposer device during said testing of said DUT, said thermal head comprising said cold plate; and a thermal controller for coupling with said stand-alone active thermal interposer device to control said plurality of heating zones and to control said cold plate, said thermal controller comprising firmware operable to perform thermal regulation during testing of said DUT.

21. The testing arrangement of claim 20, wherein said firmware is further operable to:

obtain first temperatures which are of said cold plate from a temperature sensor of said cold plate;

obtain second temperatures of the second surface of the stand-alone active thermal interposer device for each heating zone thereof using respective resistance temperature detectors;

obtain third temperatures of each area of the DUT provided the DUT is active and circuitry on the load board is operable to collect a junction temperature for each area of the DUT;

based on the first temperatures, perform an outer slower loop to regulate a fan speed of the cold plate; and based on the second and third temperatures, perform an inner faster loop to regulate heater control of the plurality of heating zones of the stand-alone active thermal interposer device.

22. The testing arrangement of claim 19 wherein said plurality of thermal resistance structures comprises a plurality of trenches formed in said body layer and located between said plurality of heating zones.

23. The testing arrangement of claim 19 wherein said plurality of thermal resistance structures comprises portions raised above a surface of said body layer.

24. The testing arrangement of claim 23 wherein said plurality of thermal resistance structures comprises a same material as said body layer.

25. The testing arrangement of claim 19 wherein said plurality of thermal resistance structures comprises a plurality of substantially similar holes formed in said body layer.

* * * * *